US012596860B2

(12) United States Patent (10) Patent No.: US 12,596,860 B2
Xi (45) Date of Patent: Apr. 7, 2026

(54) SYSTEMS AND METHODS FOR HARDWARE ACCELERATION OF MASKING AND NORMALIZING DATA WITH A TRIANGULAR INPUT MASK

(71) Applicant: Microsoft Technology Licensing, LLC, Redmond, WA (US)

(72) Inventor: Jinwen Xi, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 934 days.

(21) Appl. No.: 17/751,014

(22) Filed: May 23, 2022

(65) Prior Publication Data

US 2023/0376663 A1 Nov. 23, 2023

(51) Int. Cl.
*G06F 30/331* (2020.01)
*G06F 9/30* (2018.01)
*G06F 18/214* (2023.01)

(52) U.S. Cl.
CPC ........ G06F 30/331 (2020.01); G06F 9/30029 (2013.01); G06F 18/2155 (2023.01)

(58) Field of Classification Search
CPC .................................................... G06F 30/331
See application file for complete search history.

(56) References Cited

U.S. PATENT DOCUMENTS

2021/0294784 A1* 9/2021 Ihor ....................... G06N 3/063

FOREIGN PATENT DOCUMENTS

KR 20220050037 A 4/2022

OTHER PUBLICATIONS

Severance, A. (2015). Broadening the applicability of FPGA-based soft vector processors (Doctoral dissertation, University of British Columbia). (Year: 2015).*
Arithmetic logic unit—Wikipedia. Apr. 30, 2022. (Year: 2022).*
Lu, et al., "Hardware Accelerator for Multi-Head Attention and Position-Wise Feed-Forward in the Transformer", In Proceedings of IEEE 33rd International System-on-Chip Conference (SOCC), Sep. 8, 2020, pp. 84-89.
"International Search Report and Written Opinion Issued in PCT Application No. PCT/US23/012974", Mailed Date: May 19, 2023, 13 Pages.

(Continued)

*Primary Examiner* — Bijan Mapar

(57) ABSTRACT

A field programmable gate array including a configurable interconnect fabric connecting logic blocks implementing a circuit to: receive input data including data values organized into rows and columns, each row having N data values; select R[i] unmasked data values of a row of the input data in accordance with a mask and an index i of the row; select N–[i] unmasked data values of another row of the input data in accordance with the mask and an index of the another row; merge the R[i] unmasked data values of the row and the N–[i] data values of the another row into a combined data vector of N data values; and compute R[i] normalized values based on the R[i] unmasked data values of the combined data vector and N–[i] normalized values based on the N–[i] data values of the combined data vector to generate N normalized data values.

20 Claims, 14 Drawing Sheets

(56)     References Cited

OTHER PUBLICATIONS

Peng, et al., "Accelerating Transformer-based Deep Learning Models on FPGAs using Column Balanced Block Pruning", In Proceedings of 22nd International Symposium on Quality Electronic Design (ISQED), Apr. 7, 2021, pp. 142-148.
Communication under Rule 71(3) Received in European Patent Application No. 23710552.3, mailed on Dec. 12, 2025, 07 pages.

* cited by examiner

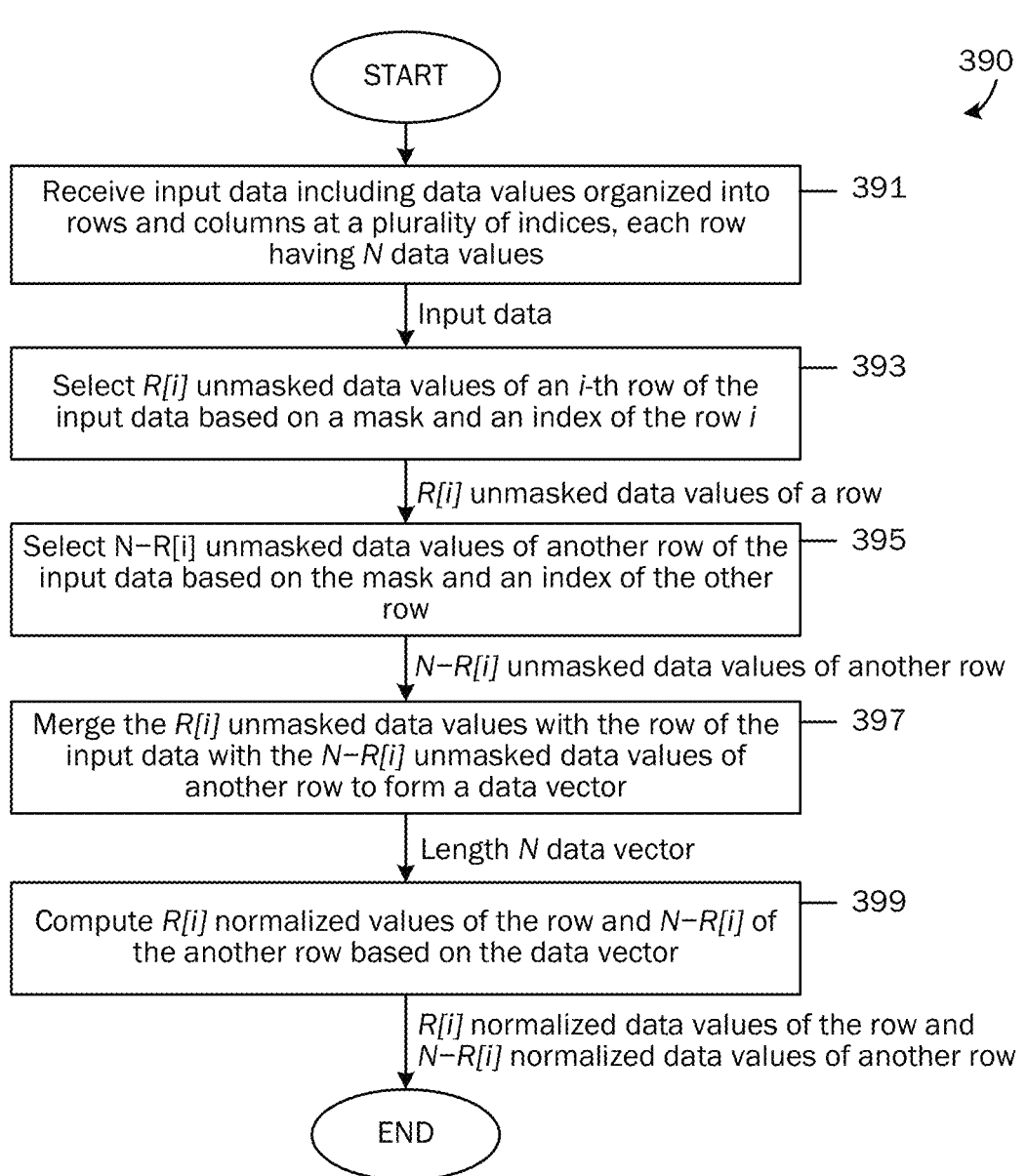

START

Receive input data including data values organized into rows and columns at a plurality of indices, each row having *N* data values — 391

Input data

Select *R[i]* unmasked data values of an *i*-th row of the input data based on a mask and an index of the row *i* — 393

*R[i]* unmasked data values of a row

Select N−R[i] unmasked data values of another row of the input data based on the mask and an index of the other row — 395

*N−R[i]* unmasked data values of another row

Merge the *R[i]* unmasked data values with the row of the input data with the *N−R[i]* unmasked data values of another row to form a data vector — 397

Length *N* data vector

Compute *R[i]* normalized values of the row and *N−R[i]* of the another row based on the data vector — 399

*R[i]* normalized data values of the row and *N−R[i]* normalized data values of another row

END

START

Read input data vector
for row m (X[m]) —— 531

Read input data vector
for row N−m−2
(X[N−m−2]) —— 532

Apply mask
corresponding to row
m —— 533

Apply mask
corresponding to row
N−m−2 —— 534

Combine masked rows at non-
overlapping positions —— 535

END

MOBILE COMPUTING DEVICE

SYSTEMS AND METHODS FOR HARDWARE ACCELERATION OF MASKING AND NORMALIZING DATA WITH A TRIANGULAR INPUT MASK

BACKGROUND

A field programmable gate array (FPGA) is a hardware device that includes an array of logic blocks and reconfigurable interconnects between those logic blocks. In Intel® (or, formerly, Altera®) products, these logic blocks may be referred to as Adaptive Logic Modules (ALMs) and in Xilinx® products, these may be referred to as Configurable Logic Blocks (CLBs). Each logic block may include programmable logic, such as one or more look up tables (LUTs) for performing configurable logical mappings from inputs to outputs, an adder for adding input values, a register for temporarily holding data, and the like. Programming or configuring an FPGA with a configuration file sets the interconnects (or interconnect "fabric") to wire together the different logic blocks, thereby configuring the FPGA to perform the particular function specified by the configuration file (sometimes referred to as a "bit file").

Compared to software implementations executed by a general purpose processor, an FPGA brings the benefits of higher performance and lower power consumption of implementing computations at a low level (e.g., at a circuit level). This is similar to the benefits of using an application specific integrated circuit (ASIC) such as specialized co-processors such as a graphics processing unit (GPU) or neural accelerator, which are used to accelerate operations specific to computer graphics and artificial neural networks, respectively. However, the design and fabrication of ASICs is a long, expensive process with high upfront fixed costs.

Accordingly, some applications of FPGAs include, for example, prototyping for hardware design that may eventually be implemented in an ASIC as well as hardware acceleration of computations in circumstances where designing and fabricating an ASIC may not be justified (e.g., due to low quantities or high specialization of the computations). In addition, FPGAs also provide flexibility of reconfiguration of the underlying hardware (in the "field") without being locked into a fixed hardware configuration, as in the case of an ASIC, where the logic is directly implemented in the layout of a circuit at the time of fabrication and therefore has little to no reconfigurability. Some cloud computing providers provide access to hardware instances (e.g., servers) that include connected FPGAs, thereby allowing users to customize the FPGA to perform hardware acceleration of computational operations.

It is with respect to these and other considerations that examples have been made. In addition, although relatively specific problems have been discussed, it should be understood that the examples should not be limited to solving the specific problems identified in the background.

SUMMARY

This summary is provided to introduce a selection of concepts in a simplified form that are further described below in the Detailed Description section. This summary is not intended to identify key features or essential features of the claimed subject matter, nor is it intended as an aid in determining the scope of the claimed subject matter.

Aspects of the present technology relates to the hardware acceleration of data masking and the computation of a softmax function on the masked data, which are commonlyperformed operations in the field of machine learning. As one example, autoregressive transformer models, which are frequently applied in machine learning models for natural language processing, apply masks to input data in order to ensure that the transformer model learns to make predictions for a given token in a sequence of tokens based only on tokens appearing earlier in the sequence and not based on tokens appearing later in the sequence. A mask is applied to the data to enforce this autoregressive constraint by hiding (e.g., zeroing out) values that should not be considered during the training process. Considering the case of input data values arranged in an N×N matrix or array, where each row corresponds to a different sequence of tokens ordered from left to right, then the mask may block out or high data values generally on the right-hand side of each row.

A softmax function, which is also known as soft argmax or as a normalized exponential function is frequently used as the last activation function of a neural network or other machine learning model to normalize the outputs generated by the machine learning model (e.g., scores) to a constrained range (e.g., from unconstrained outputs in the range of $(-\infty, +\infty)$ to a constrained or normalized output in the range of $[0, 1]$). One typical expression of the softmax function a for an i-th element $z_i$ out of a collection or vector z of K elements is expressed as:

$$\sigma(z_i) = \frac{e^{z_i}}{\sum_{j=1}^{K} e^{z_j}} \quad y(i, j) = \frac{e^{xm(i,j)-xm\_max(i)}}{\sum_{j=0}^{N-1} e^{xm(i,j)-xm\_max(i)}} \quad y(i, j) = \frac{e^{xm(i,j)-xm\_max(i)}}{\sum_{j=0}^{N-1} e^{xm(i,j)-xm\_max(i)}}$$

In more detail, a mask applied to the data to enforce the autoregressive constraint frequently takes the form of an upper triangular mask or upper block triangular mask when applied to an N×N input data matrix, where earlier rows (e.g., near the top of the input data matrix) have more data values masked out and later lows (e.g., near the bottom of the input data matrix) have fewer data values masked out (or no data values masked out). This may generally be expressed as where the k-th row (the rows being numbered from 0 to N−1) has k+1 unmasked data values followed by N−k−1 data values that are masked out by the mask. In such upper triangular masks, approximately half of the values of the input data matrix are masked out.

As such, some aspects of the present technology relate to combining the unmasked data values from two different rows into a single row of length N (or a length no greater than N or less than or equal to N) and performing operations (e.g., applying a function) to the individual data values of the combined rows of unmasked data values, without performing computations on masked data values (because these masked data values are not relevant to the desired final output). In the case of a triangular mask that masks out approximately half of the input data values, this has the effect of nearly doubling the computational throughput of a hardware accelerator, because computational resources are not wasted on performing calculations on masked data values that have no impact on the final result of the computation.

Some aspects of the present technology further relate to implementing the behavior of the mask within the hardware accelerator, thereby avoiding the bandwidth and latency costs associated with transferring a mask from a host to the hardware accelerator. In addition, avoiding computations associated with applying a mask to the input data further reduces the computational load on the hardware accelerator.

The hardware acceleration of data masking and normalization of data according to various aspects of the present technology therefore improves the performance of machine learning model training processes that include such operations. The improvements in performance relate to reductions in computing time (e.g., processor time), reductions in data storage and bandwidth (e.g., memory usage and data transferred over communications buses), energy consumption, and, in some examples, reduces the amount of physical hardware used in certain implementations on field programmable gate arrays (FPGAs) as well as in other hardware implementations such as application specific integrated circuits (ASICs) and other special-purpose integrated circuits.

The details of one or more aspects are set forth in the accompanying drawings and description below. Other features and advantages will be apparent from a reading of the following detailed description and a review of the associated drawings. It is to be understood that the following detailed description is explanatory only and is not restrictive of the invention as claimed.

BRIEF DESCRIPTION OF THE DRAWINGS

The accompanying drawings, which are incorporated in and constitute a part of this disclosure, illustrate various aspects of the present invention. In the drawings:

FIG. 3B is a flowchart of a method for masking data and normalizing input data using a mask-normalize circuit according to one example.

DETAILED DESCRIPTION

Figure 1:
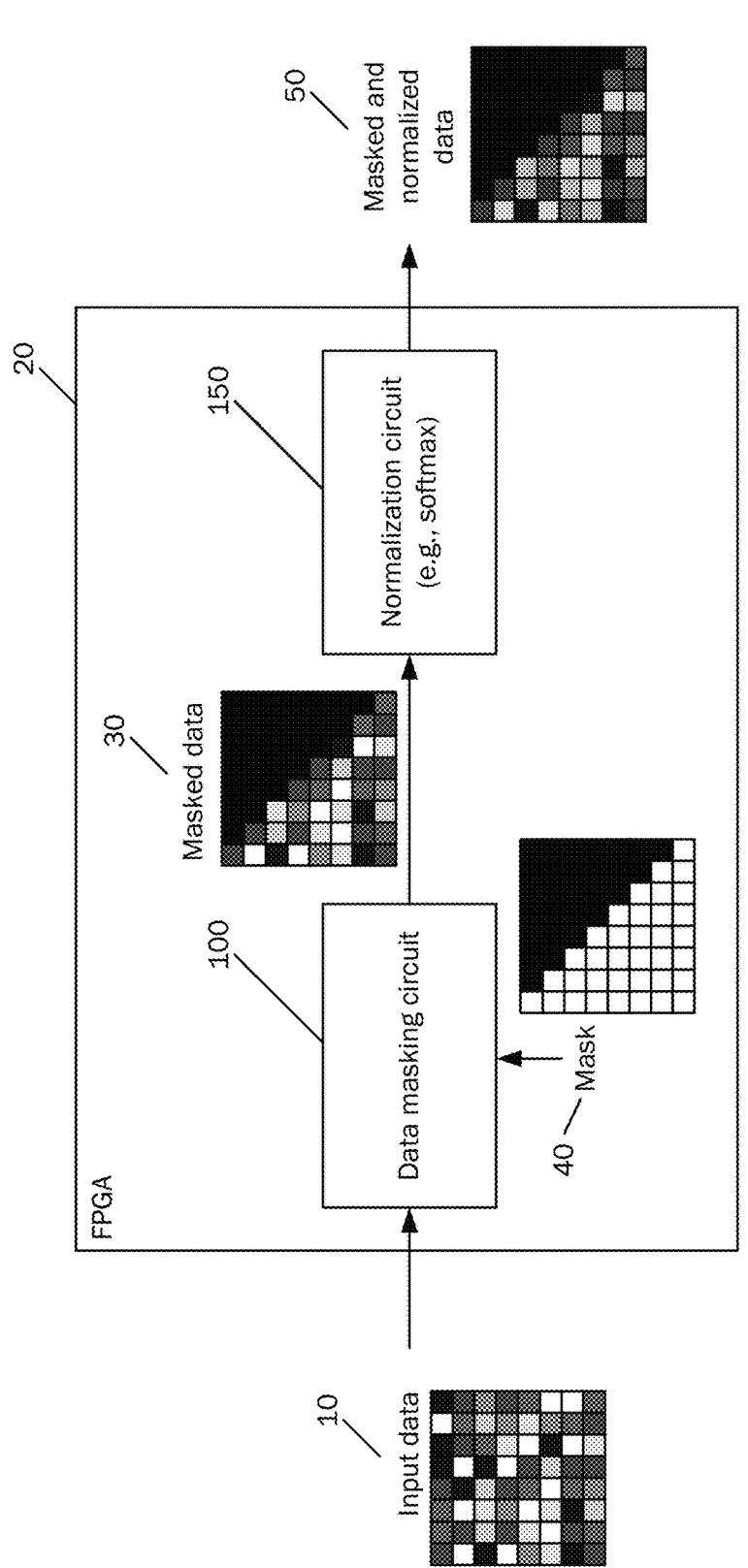
FIG. 1 depicts a high level diagram of masking input data by a data masking circuit implemented by a field programmable gate array (FPGA) to generate masked data according to one example.

The following detailed description refers to the accompanying drawings. Wherever possible, the same reference numbers are used in the drawing and the following description to refer to the same or similar elements. While aspects of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention, but instead, the proper scope of the invention is defined by the appended claims. Examples may take the form of a hardware implementation, or an entirely software implementation, or an implementation combining software and hardware aspects. The following detailed description is, therefore, not to be taken in a limiting sense.

The present technology relates to systems and methods for accelerating the masking of data and normalizing the data, such as by applying the SoftMax function, using hardware such as a field programmable gate array (FPGA). One use case for FPGAs is the acceleration of computations that are associated with machine leaning tasks such as computer vision (e.g., image classification, instance segmentation, and the like), natural language processing (e.g., transformer models), and the like. Training a machine learning model, such as a deep neural network (DNN), may take hours of computing time for a small model and may take weeks or months of computing time for large models. Moving computationally expensive operations from programs running on relatively slow, general purpose processors (e.g., CPUs) or shaders running on graphics processing units (GPUs) onto FPGAs specifically configured to perform those expensive mathematical operations can provide significant reductions in total compute time and reductions in power consumption.

When training some types of machine learning models, masks are used to hide or remove or mask-out some data values during the training process. FIG. 1 depicts a high level diagram of masking input data 10 by a data masking circuit 100 and a normalization circuit 150 (that applies a normalization function such as SoftMax to the input data) as implemented by a field programmable gate array (FPGA) 20 to generate normalized masked data 30 according to one example. In particular, the data masking circuit 100 may apply a mask 40 to the input data to hide (or remove or replace or mask out) data values in the input data 10 with other values, such as a constant value or values from another data source and the normalization circuit 150 may normalize the values of the masked data on a row-by-row basis. In machine learning models, masking is used in order to improve the performance of the resulting trained models, such as by ensuring that the models do not learn to make predictions based on future data.

For example, transformer models have been widely adopted in natural language processing (NLP) applications such as machine translation, question answering, and the like. A large portion of transformer models are autoregressive, meaning that a token at position [i] cannot be computed based on information from tokens at positions [i+1] or onward. For example, a transformer model that is being trained to predict the next word in a sentence can only rely on the words that precede the word to be predicted and not later words in the sentence that may be contained in a sample of training data for training the NLP transformer model.

All layers in a transformer model operate along the hidden dimension (and can ignore this constraint) except for the self-attention heads, which operate along the sequence dimension. To enforce the autoregressive constraint, a mask is used to mask out tokens at positions greater than or equal to [i+1] (e.g., after the current token at position i). FIG. 1 depicts an example of an attention score matrix supplied as the input data 10, where the rows are labeled in increasing index from top to bottom (e.g., index i from 0 to 7) and from left to right (e.g., index j from 0 to 7). The mask 40 is shown in FIG. 1 as an upper triangular mask to mask out the upper right triangle of the attention score matrix to produce the masked data 30, corresponding to the locations of where positions j are greater than or equal to [i+1]. The masked data 30 is then provided to a normalization circuit 150, which normalizes the masked data 30 (e.g., on a row-by-row basis) and outputs the masked and normalized data, which may be used by a next part of the machine learning process or model training process, such as to update the trainable parameters of the machine learning model (e.g., by applying the backpropagation algorithm to update the weights of connections between layers of a neural network).

Figure 2:
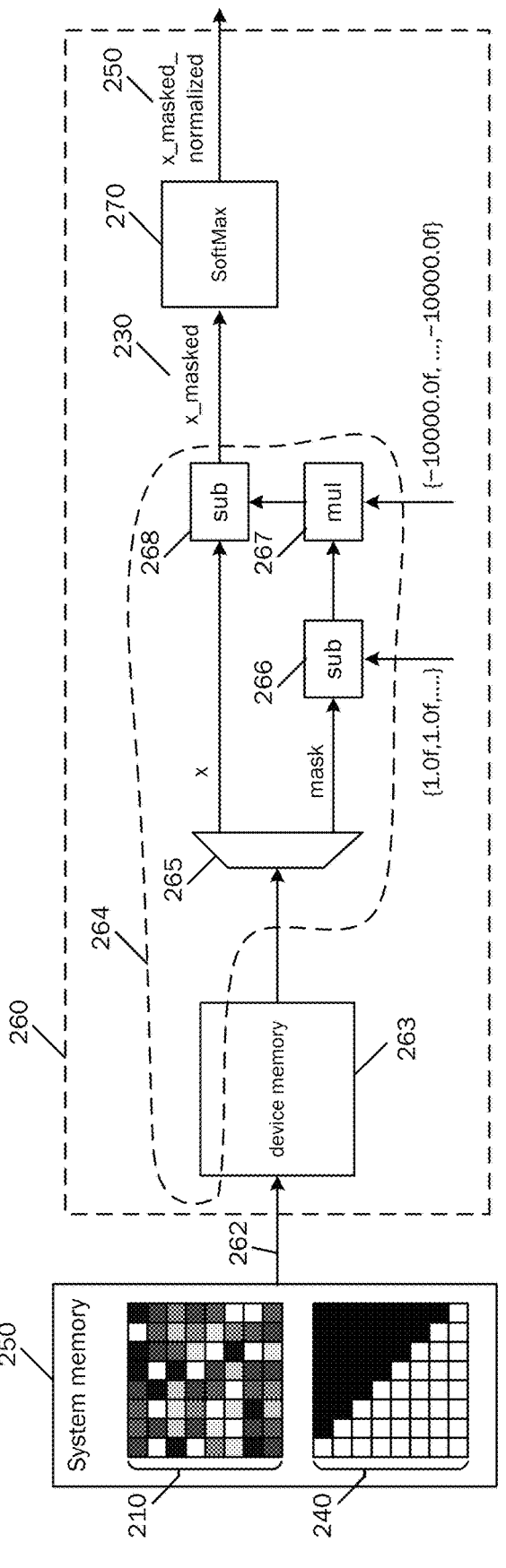
FIG. 2 depicts an example comparative system configured to mask data.

For a transformer model with a maximum sequence length of N, the attention mask has dimensions N×N, corresponding to $N^2$ elements of the storage overhead. FIG. 2 depicts an example comparative system configured to mask data. As shown in FIG. 2, the input data 210 and the data representing the attention mask 240 are stored in system memory 250, such as the main memory of a computing device or on-chip or on-accelerator memory (e.g., the memory of a GPU of a computing device or a cache in a system-on-chip device). The training example input data 210 and the attention mask 240 are supplied to a vector processor/accelerator 260 over a communications bus 262 (e.g., Peripheral Component Interconnect Express (PCIe) or other interconnection bus) and may be stored in device memory 263 (e.g., in registers of the vector processor/accelerator 260) to perform a computation to mask the training example input data 210 and generate corresponding masked training example input data (x_masked) 230. In particular, in some comparative systems, attention mask storage and logic 264 is used to compute the masked training example input data (x_masked) 230 in accordance with the following:

$$x\_masked(i,j) = x(i,j) - 10000.0 \cdot [1.0 - mask(i,j)],$$

$$\text{where } mask(i,j) \in \{0.0, 1.0\} \tag{1}$$

In more detail, in the system shown in FIG. 2, a demultiplexer (DEMUX) 265 is used to route training example input data 210 and attention mask 240 along different data paths, where a first floating point subtraction circuit 266, a floating point multiplier 267, and a second floating point subtraction circuit 268 are used to implement Equation (1). While the attention mask storage and logic 264 is shown in FIG. 2 as a set of discrete functional blocks, such comparative accelerators 260 may also be implemented using, for example, software code (e.g., programs or shaders) controlling the operations of a vector processor or a graphics processing unit. As a result, the original value of the training example input data 210 is preserved at locations (i,j) where the mask data at (i,j) was 1.0f, and the original data is replaced with the value x−10,000 at locations (i,j) where the mask data at (i,j) was 0.0f.

In the comparative system shown in FIG. 2, the masked training example input data (x_masked) 230 is supplied to a softmax circuit 270 implementing a SoftMax function. A SoftMax function 6 is typically computed on an i-th value $z_i$ of an input vector z of values, where $z_{max}$ is the largest value in z, in accordance with:

$$\sigma(z_i) = \frac{e^{z_i - z_{max}}}{\sum_{j=1}^{K} e^{z_j - z_{max}}}$$

As seen above, the numerator of the SoftMax function is $e^{z_i}$. Therefore, the value of the SoftMax approaches 0 as the input value $z_i$ approaches $-\infty$. In practice, supplying a sufficiently large negative number (a negative number having a large absolute value) as input to the SoftMax function a will produce a number that is small enough to be rounded to zero, or to be effectively zero for the purposes of the algorithm to be accelerated (e.g., the training of a machine learning model). In the above example shown in FIG. 2 and Equation (1), it is assumed that the values are represented in a low-precision floating point format such as BFloat16, IEEE half-precision 16-bit float FP16, or the like. The masked vector x_masked will go through the SoftMax layer 270 so that those masked out locations that are fully attenuated by the masking operation yield a zero value after the SoftMax. Because the magnitude of x does not exceed 1,000 from all current transformer models, a constant alternative value of −10,000 was chosen because $e^{x-10000}$ will be rounded to zero in most low-precision floating-point formats. In some examples, machine learning models make use of training example data values (or activations of internal layers to be masked) that fall within different ranges. For example, if the magnitude of x is does not exceed 100,000, a constant value applied during masking may be, for example, −200,000 or −1,000,000.

In addition, when using low-precision floating point format arithmetic, SoftMax is prone to accumulation overflow due to the exponential function (e.g., $e^z$) when the input (e.g., z) is unbounded. In practice, when computing SoftMax function for the values of a row, the maximum data value from that row is subtracted from each value in the row so that the values being accumulated are bounded to the range of 0 to 1 (the range [0, 1]).

The example system shown in FIG. 2 illustrates some limitations exhibited by comparative accelerators configured to apply a mask to input data. These limitations include: memory storage overhead, memory bandwidth overhead, and arithmetic overhead.

Regarding memory storage overhead, the mask has the same dimensions as the input training example data and is typically specified using the same data type as the input training example data. For example, if the input training example data is an N×N matrix of 16-bit floating point values (e.g., BFloat16 or FP16), then the input training example data and the mask each has a size of $16 \cdot N^2$ bits (or, equivalently, $2 N^2$ bytes), for a total of $32 N^2$ bits or $4 N^2$ bytes that must be stored in the device memory 263. For example, a typical sequence length of 2048 tokens requires 8 megabytes (MB) memory space to store the mask in 16-bit floating-point precision (e.g., in BFloat16 or FP16 floating-point data formats). When the accelerator is implemented using a vector processor/accelerator with limited on-chip memory, 8 MB of mask data buffer is a substantial overhead and greatly increases the cost of manufacturing the underlying chip or FPGA hardware in the case of FPGA-based designs, or may require dedicating additional logic blocks of the FPGA to implementing a larger memory (instead of additional compute or other purposes), thereby decreasing throughput and/or increasing power consumption.

Regarding memory bandwidth overhead, as seen in FIG. 2, the attention mask 240 stored in the memory is fetched or transmitted from the system memory 250 to the vector processor/accelerator 260 over a communications bus 262, and consumes as much bandwidth as fetching the training example input data 210. Training a large machine learning model (such as a transformer) typically involves multiple processors/accelerators 260 fetching data from multiple memory banks of the system memory 250 simultaneously or concurrently over a shared communications bus 262, and therefore benefits from efficient usage of the memory bandwidth. However, in the arrangement shown in FIG. 2, fetching the attention mask 240 over this shared communications bus 262 imposes an additional 1× memory bandwidth and may become a system performance bottleneck.

Regarding arithmetic overhead, in the system shown in FIG. 2, each attention mask operation performed in accordance with Equation (1) requires one floating point multiplication and two floating point subtractions, which consume a significant portion of the floating-point computing resources of a vector processor and/or a significant number of logic blocks of an FPGA. Computing the mask also requires a non-neglectable amount of computational energy (on the order of $3N^2$ floating point operations for an (N,N)-shape tensor). This is particularly significant when when the input tensors feature a large sequence length (e.g., for large values of N).

In addition, the SoftMax block 270 applies the SoftMax value to each data value in each row of the masked data x_masked 230, without regard to whether those data values are masked. However, in the example shown in FIG. 2, the application of the mask causes the masked data values to be large negative values, and, as discussed above, the large negative value is chosen such that the exponential of the masked values will round to zero. As such, it is already known that the SoftMax output of those masked values will be 0, and therefore computing the SoftMax function on these masked values represent wasted computations (e.g., wasted computational effort). Referring back to FIG. 1 and FIG. 2, in the case of an upper triangular mask 240, this may result in up to approximately 50% wasted computations because approximately half of the input data values are masked out.

These limitations of accelerator designs that exhibit one or more of the above characteristics provide opportunities for increased energy efficiency, storage efficiency, bandwidth efficiency, and computation speed in accordance with various examples of the present technology, which enables attention mask generation with a small memory footprint and a mask operations with fewer float-point operations. Such improvements enable examples of the present technology to provide cost-effective solutions for training large machine learning models, such as state-of-the-art autoregressive transformer models.

Accordingly, aspects of the present technology relate to systems and methods that fuse a triangular mask with a computing kernel for applying other functions, such as normalization functions like SoftMax, on the unmasked data. In some examples, the present technology removes the need to transmit mask data between a host (e.g., main memory of a computer system) to a hardware accelerator (e.g., device memory integrated into a hardware accelerator such as block memory or BRAM in the case of a hardware accelerator implemented using a field programmable gate array or FPGA). Instead, aspects of the present technology relate to implementing a mask within the logic of the hardware accelerator and combining two masked row vectors into one combined data vector having the same overall sequence length as the input data rows (e.g., by using the space in the data vector that would otherwise have been occupied by masked data values). A function, such as SoftMax, is applied to the combined data vector to calculate the results of the function for both rows in a single pass. In circumstances where approximately 50% of the input data values are masked-out by a mask, examples of the present technology may approximately double the throughput of the accelerator.

Figure 3A:
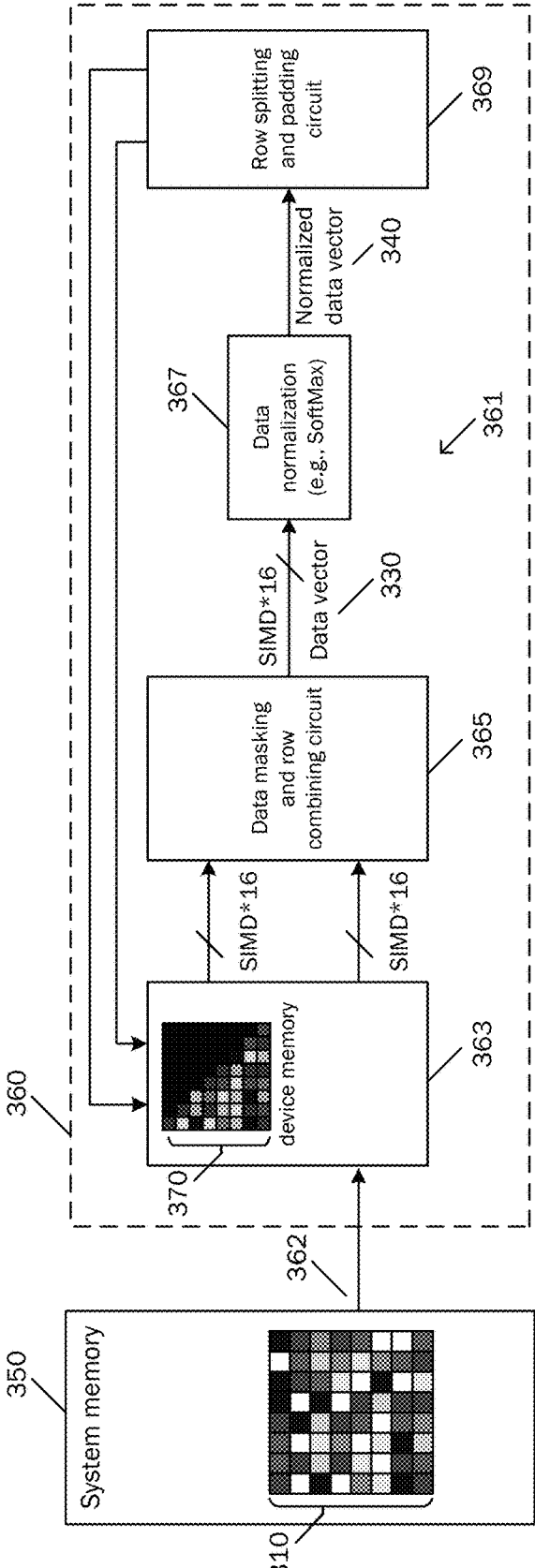
FIG. 3A is a block diagram of an accelerator including a mask-normalize circuit configured to mask and normalize input data according to one example.

FIG. 3A is a block diagram of an accelerator including a mask-normalize circuit configured to mask and normalize input data according to one example. FIG. 3B is a flowchart of a method for masking data and normalizing input data using a mask-normalize circuit according to one example.

As shown in FIG. 3A, training example input data 310 is stored in system memory 350, which is provided to an accelerator 360 that includes a mask-normalize circuit 361 via a communications bus 362 and stored in device memory 363 of the accelerator 360 (e.g., block memory or BRAM in the case of an FPGA implementation of an accelerator). Accordingly, in some examples, in operation 391 of FIG. 3B, the accelerator 360 receives input data 310 including data values at a plurality of indices. In the example shown in FIG. 3A, the input data 310 is arranged in a two-dimensional array (or matrix) of data values, where each data value is located at a two-dimensional index (e.g., a row and a column coordinate pair) of the matrix. While FIG. 3A shows the input data 310 as being arranged in a square array (e.g., having the same number of rows and columns such as an N×N array), examples of the present technology are not limited thereto, and include circumstances where the input data values are arranged in a rectangular array as an N×M array) of data values.

Figures 4A, 4B:
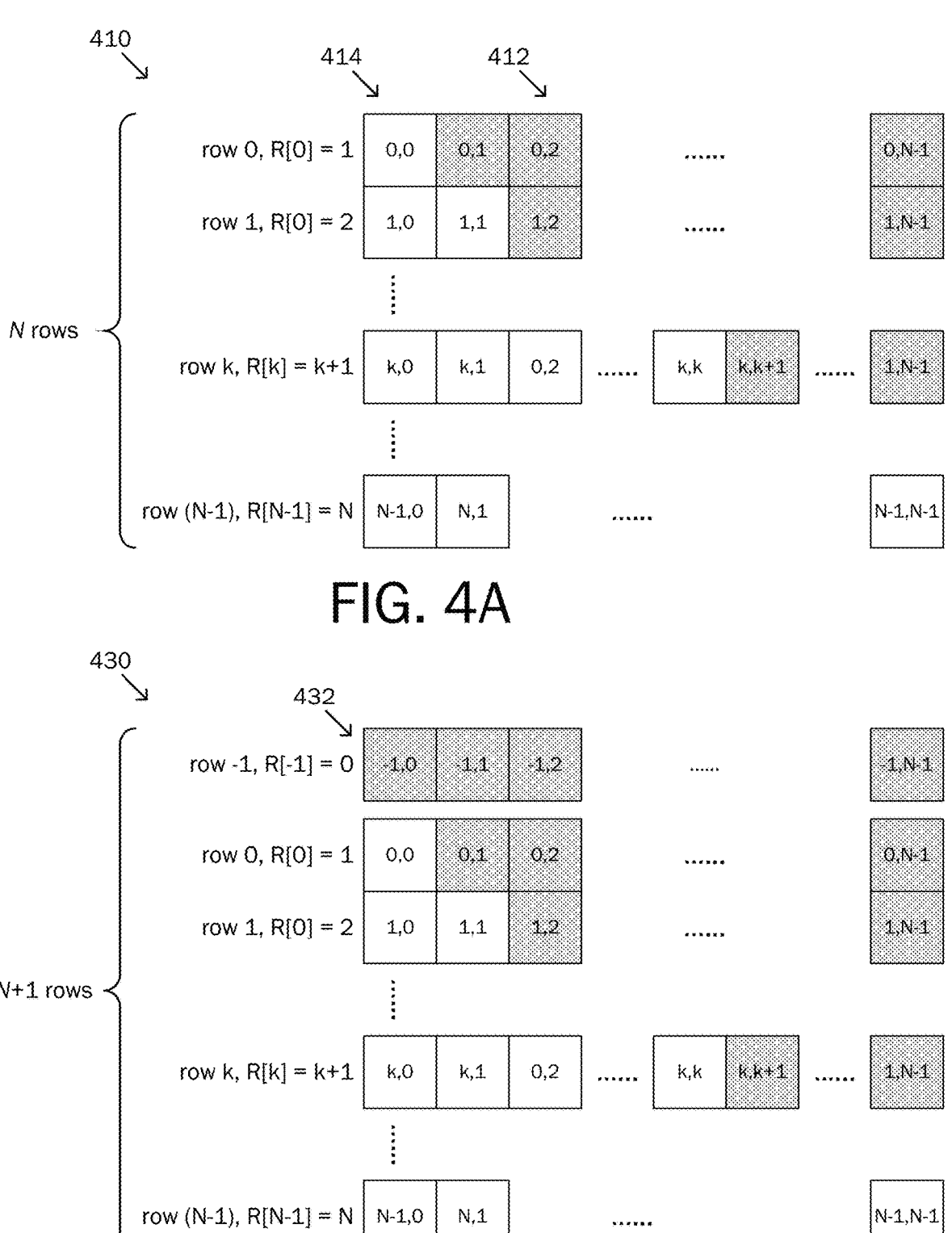
FIG. 4A is a schematic depiction of input data including a plurality of data values arranged into rows and columns at a plurality of indices of the input data, each row having N values, where some data values are masked out by an upper triangular data mask.
FIG. 4B is a schematic depiction of the masked input data shown in FIG. 4A, padded with a dummy row according to one example.

FIG. 4A is a schematic depiction of input data 410 including a plurality of data values arranged into N rows and N columns at a plurality of indices of the input data, where some data values are masked out by an upper triangular data mask. In more detail, FIG. 4A depicts an (N,N)-shaped input tensor 410 (e.g., having N rows and N columns, e.g., an N×N square matrix) with a triangular mask where the masked-out data values 412 (at masked-out locations) are shaded with a pattern and the unmasked data values 414 (at unmasked locations) are unshaded (e.g., have white backgrounds). R[i] is the number of non-masked or unmasked data values in row i. FIG. 4A depicts a particular example of an upper triangular mask where the upper triangular mask masks-out values at row-column indices (r,c) where r<c, such that a row indexed at i has R[i]=(i+1). However, the present technology is not limited thereto and may also be applied to other masks having different shapes, such as block triangular masks, where values at row-column indices (r,c) are masked out when k([r/k])<c and where R[i]=k([i/k]), where k is a configurable parameter referring to a step size of the block triangular mask. In some examples, the step size parameter k is set to be equal to the length of a SIMD vector supported by an arithmetic unit (e.g., the number of data values the arithmetic unit can process in parallel), although the present technology is not limited thereto.

FIG. 4B is a schematic depiction of the masked input data 430 corresponding to the masked input data 410 shown in FIG. 4A, padded with a dummy row 432 according to one example. In the particular example shown in FIG. 4B, a data masking and row combining circuit 365 of the mask-normalize circuit 361 pads the input data with a dummy row 432 indexed by −1 (negative one, where R[−1]=0) before row 0 to form a (N+1, N)-shape tensor (e.g., having N+1 rows and N columns). With i in the range of [0, N/2−1] (assuming N is even), the first R[i] elements of each row are unmasked and the remaining N−R[i] elements are masked. In the case of a block triangular mask, in some examples the input data is padded with k dummy rows (e.g., indexed from −1 to −k), where each of these dummy rows has R=0.

Referring to FIG. 3B, at operation 393, the data masking and row combining circuit 365 of the mask-normalize circuit 361 selects the R[i] unmasked data values from an i-th row of the input data, where the R[i] values are specified by the mask (e.g., the first i+1 elements of the row in the case of an upper triangular mask). At operation 395, the data masking and row combining circuit 365 of the mask-normalize circuit 361 selects the N−R[i] unmasked values of another row of the input data, based on the mask and the index of the other row. In particular, when the mask is a triangular mask or a block triangular mask, for a given row in the input data (having N data values in each row) with exactly R[i] unmasked data values, there is another row in the (padded) input data with a complementary number of unmasked data values, e.g., each i-th row has at least one corresponding j-th row where R[j]=N−R[i].

In the specific case of an upper triangular mask, let X[i] select the i-th row from the input data (an N×N tensor or matrix), in which case a (i+1)-length sub-vector S0(X[i]) of data values is constructed by taking the unmasked data values at indices: {X[i][0], . . . X[i][i]}. Similarly, another (N−i−1)-length sub-vector S1(X[N−i−2]) is formed by taking the unmasked data values at indices X[N−i−2]={X[N−i−2][0], X[N−i−2][1] . . . , X[N−i−2][N−i−2]}. For the dummy row indexed by −1, S0(X[−1])={ } (the dummy row or dummy rows have no unmasked data values), and its corresponding complementary row is S1(X[N−1])=X[N−1] (e.g., the row or rows having N unmasked data values).

Figure 4C:
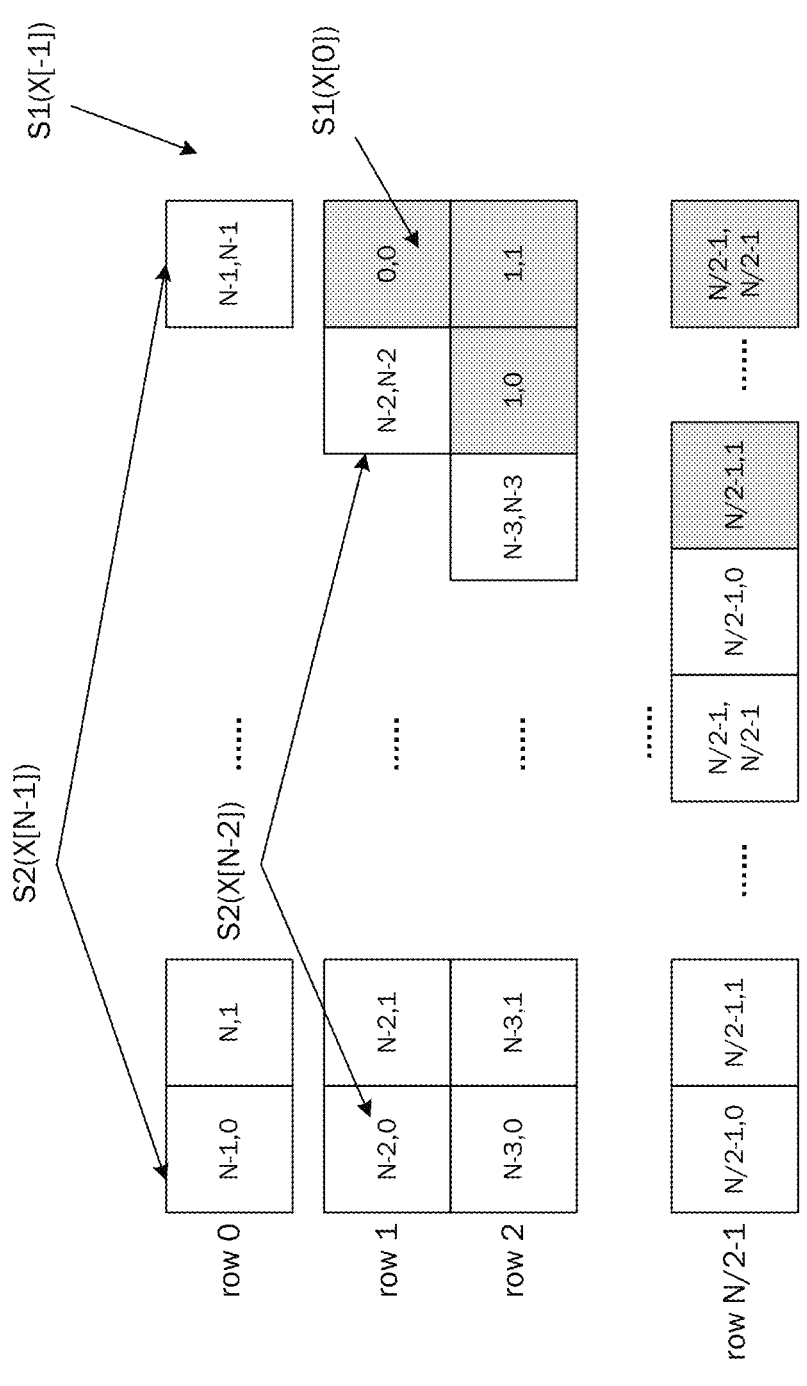
FIG. 4C is a schematic depiction of the merging of unmasked data values of the data rows of the input data to form a plurality of combined data vectors (approximately N/2 data vectors) Xbar according to one example.

FIG. 4C is a schematic depiction of the merging of unmasked data values of the data rows of the input data to form a plurality of combined data vectors (N/2+1 data vectors when N is even and (N+1)/2 data vectors when N is odd, while typical transformer models use sequence lengths N that are even) Xbar according to one example. At operation 395 as shown in FIG. 3B, the data masking and row combining circuit 365 of the mask-normalize circuit 361 merges or combines data from two different rows having complementary numbers of unmasked data values (e.g., combining R[i] data values from an i-th row and R[j] data values from a complementary j-th row, where R[i]+R[j]=N or, in some examples, where R[i]+R[j]; N).

Referring back to the example above, concatenating the vector S0(X[i]) of unmasked data values taken from the i-th row together with the vector S1(X[N−i−2]) of unmasked data values taken from another, complementary, row (the N−i−2-th row) will form a new N-length vector Xbar[i]. As shown in FIG. 4C, each new vector Xbar combines the data values or elements from up to two rows of the original input data tensor, where each X[i][U] is a single data value from the input tensor. No data values of merged vectors Xbar[m] are masked out.

In some examples, the m-th row of Xbar is constructed as follows:

$$Xbar[m]=\{X[N-m-1,0],X[N-m-1,1] \ldots ,X[N-m-1, N-m-1],X[m-1,0],X[m-11], \ldots ,X[m-1,m-1])\}$$

For example:

$$Xbar[0]=concat(S1(X[N-1]),S0(X[-1]))$$

$$Xbar[1]=concat(S1(X[N-2]),S0(X[0]))$$

$$Xbar[N/2-2]=concat(S1(X[N/2-3]),S0(X[N/2+1]))$$

$$Xbar[N/2-1]=concat(S1(X[N/2-1]),S0(X[N/2-1]))$$

While the above example shows that each row Xbar[m] first includes the unmasked input data values from row X[N−m−1] followed by the unmasked input data values from row X[m−1], the present technology is not limited thereto. In some examples, each row Xbar[m] first includes the input data values from the unmasked input data values from row X[m−1] followed by the unmasked input data values from row X[N−m−1].

Because each row of the input data is combined with another, complementary row of the input data, the total number of rows of combined of data in Xbar is N/2 (e.g., Xbar has N/2 rows each having N data values). (In the case of a block triangular mask, the total number of rows may be larger than N/2, but is approximately equal to N/2 when N is much greater than k.) In the case where N is an even number (which is typical in transformer machine learning models), all of the data values in Xbar[0] come from the same row, that is, row X[N−1]. Similarly, in the case of a triangular mask, all of the data values in row Xbar[N/2-1] also come from the same row, because these are the unmasked data values of row X[N/2-1], which has N/2 data values and where its complementary data row is itself (when applying a triangular mask, there is no other row with N/2 unmasked data values).

Referring back to FIG. 3A, after applying the mask and combining the unmasked data values from different rows, the merged rows or data vector 330 are supplied to a data normalization circuit 367 of the mask-normalize circuit 361, which computes normalized values of the data values in the combined rows at operation 399, such as by applying the SoftMax function to each row. In more detail, the data normalization circuit may first find the maximum value Xbar_max[m] from an m-th row Xbar[m] of data vector Xbar. The data normalization circuit 367 then applies a modified SoftMax algorithm on each modified row vector Xbar[m] based on the maximum value Xbar_max[m] to compute a normalized Ybar[m] of normalized data vector Ybar such as by computing in some examples:

$$Ybar[m] = \mathrm{Softmax}(Xbar[m]) =$$

$$\begin{cases} \dfrac{\exp(Xbar[m][i] - \mathrm{Xbar\_max}[m])}{\sum_{i=0}^{N-m-1} \exp(Xbar[m][i] - \mathrm{Xbar\_max}[m])} & \text{when } i < N - m \\ \dfrac{\exp(Xbar[m][N - m - i] - \mathrm{Xbar\_max}[m])}{\sum_{i=0}^{m-1} \exp(Xbar[m][N - m - i] - \mathrm{Xbar\_max}[m])} & \text{when } i \geq N - m \end{cases}$$

When m=0, corresponding to the last row from X with zero masking, the output Ybar[0] holds the normalized data values (SoftMax results) corresponding to the full last row X[N−1].

When m=N/2-1, corresponding to the middle row with half of the data values being masked, the two halves of the output are identical (the first N/2 data values and the second N/2 data values of Y[N/2-1] are identical) and both correspond to the normalized values (e.g., the SoftMax results) of the middle row (X[N/2-1]).

When 0<m<N/2-1, each output row includes the normalized data values (e.g., SoftMax results) of two different input rows: X[m-1] and X[N-m-1].

As shown in the equation above for computing SoftMax (Xbar[m]) according to some examples of the present technology, the data normalization circuit 367 performs the input normalization by subtracting from the maximum value (Xbar_max[m]) of the two combined rows (row X[m-1] and row X[N-m-1] combined into row Xbar[m]) to ensure numerical stability.

The data normalization circuit 367 accumulates the exponentiations of the data values of the two sub-vectors in separate accumulators (e.g., one accumulator for the case where i<N-m holding the data values for row X[N-m-1] and another accumulator for the case where i≥N-m holding the data values for row X[m-1]). The two accumulated values serve as the denominators for normalizing the exponentiations of the data values of their respective sub-vectors, where the exponentiation of each data value of each sub-vector (after subtracting the maximum value) is divided by the denominator corresponding to the sub-vector, thereby computing the SoftMax normalized data values of the row or rows contained in the combined row Xbar[m].

As such, instead of merely discarding the masked-out input data by forcing the corresponding exponential inputs to be a large negative value hence zeroing out the exponential function exp(x), examples of the present technology use the available computational bandwidth (that would otherwise be used to perform discarded operations) to normalize two rows of the original tensor by combining two complementary-length rows of unmasked data to form a transformed row with zero masked-out locations.

The normalized data vector 340 containing combined rows are supplied to a row splitting and padding circuit 369 of the mask-normalize circuit 361, which separates the combined rows Ybar[m] (e.g., having dimensions N/2×N) into the expected format of an N×N masked and normalized output tensor Y 370 (e.g., having the same dimensions as the input data 310).

In particular, in the example of a triangular mask and the arrangement of rows discussed above, the unmasked data values of first N/2 rows of the output tensor Y are contained in the latter portion of each row, starting with index N-m through to the end of the row at index N-1, and the remaining masked values of the output row of Y 370 are 0:

$$Y[m-1]=\{Ybar[m][N-m],Ybar[m][N-m+1]\ldots,Ybar[m-1][N-1],0,0,\ldots,0\},$$

$$\text{for } 0<m<N/2$$

For the next N/2-1 rows of the output tensor Y, the unmasked data values are contained in the starting portion of each row, starting with index 0, and the remaining masked values of the row are 0:

$$Y[N-m-1]=\{Ybar[N-m-1][0],Ybar[N-m-1][1],\ldots,Ybar[N-m-1][N-m-1],0,0,\ldots,0\},$$

$$\text{for } 0<m<N/2$$

The last row of the output tensor Y is merely the first row of the normalized data vector Ybar:

$$Y[N-1]=Ybar[0] \text{ for } m=0$$

As such, a row splitting and padding circuit 369 splits rows of normalized data vectors 340 into two sub-vectors with lengths m and N-m, where the two sub-vectors are respectively padded with N-m zeroes and m zeroes to form the final SoftMax normalized results for two different output rows of the output normalized data tensor Y 370. By performing the normalization without explicitly calculating the zero values for the masked-out locations (e.g., by computing exponentiations of masked-out values to arrive at zero values) and by combining multiple rows of data into a single row, aspects of the present technology increase the performance (e.g., throughput and efficiency) of hardware accelerators configured to perform masked, row-based normalization (e.g., using masked SoftMax). The output normalized data tensor 370 by then be written back to system memory 350 for further use, such as being used as feedback for updating the parameters of a machine learning model using gradient descent and, in the case of neural network, backpropagation.

Figure 5A:
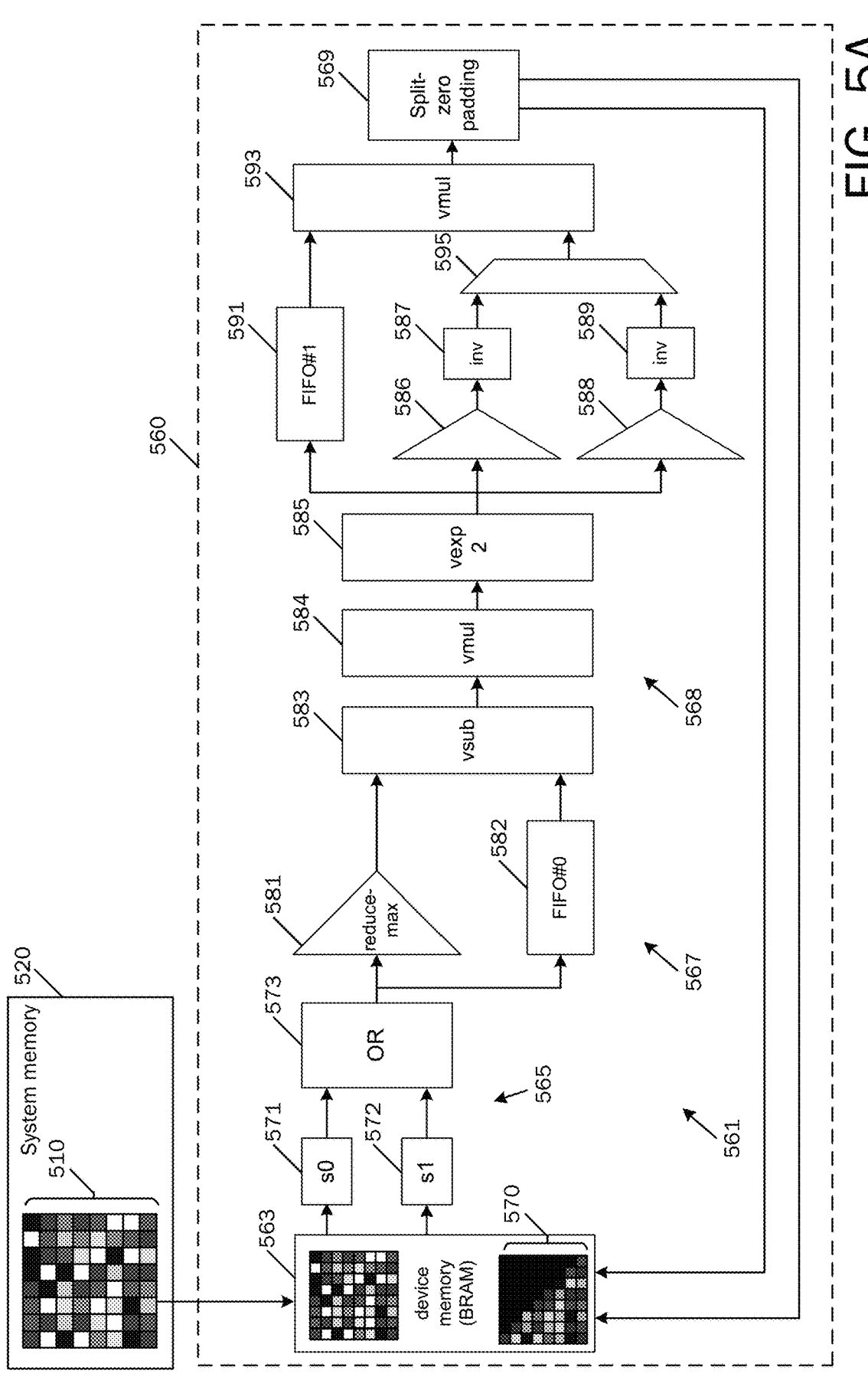
FIG. 5A is a block diagram of an accelerator including a mask normalize circuit configured to mask and normalize input data according to one example.

FIG. 5A is a block diagram of a hardware accelerator 560 including a mask-normalize circuit 561 configured to mask and normalize input data according to one example. The mask normalize circuit shown in FIG. 5A may be implemented, for example, in a field programmable gate array (FPGA), which may be part of a hardware accelerator instantiated in cloud infrastructure (e.g., connected to a host computer system in a cloud data center), where the hardware accelerator is configured to accelerate the training of transformer machine learning models. In the example shown in FIG. 5A, training data 510 are stored in system memory 520 of a host system and transferred to a hardware accelerator 560, where the training data is stored in multi-port block memory (BRAM) 563. The data transfer may be performed using a direct memory access (DMA) mechanism (e.g., without passing through the processor of the host system).

Figure 5B:
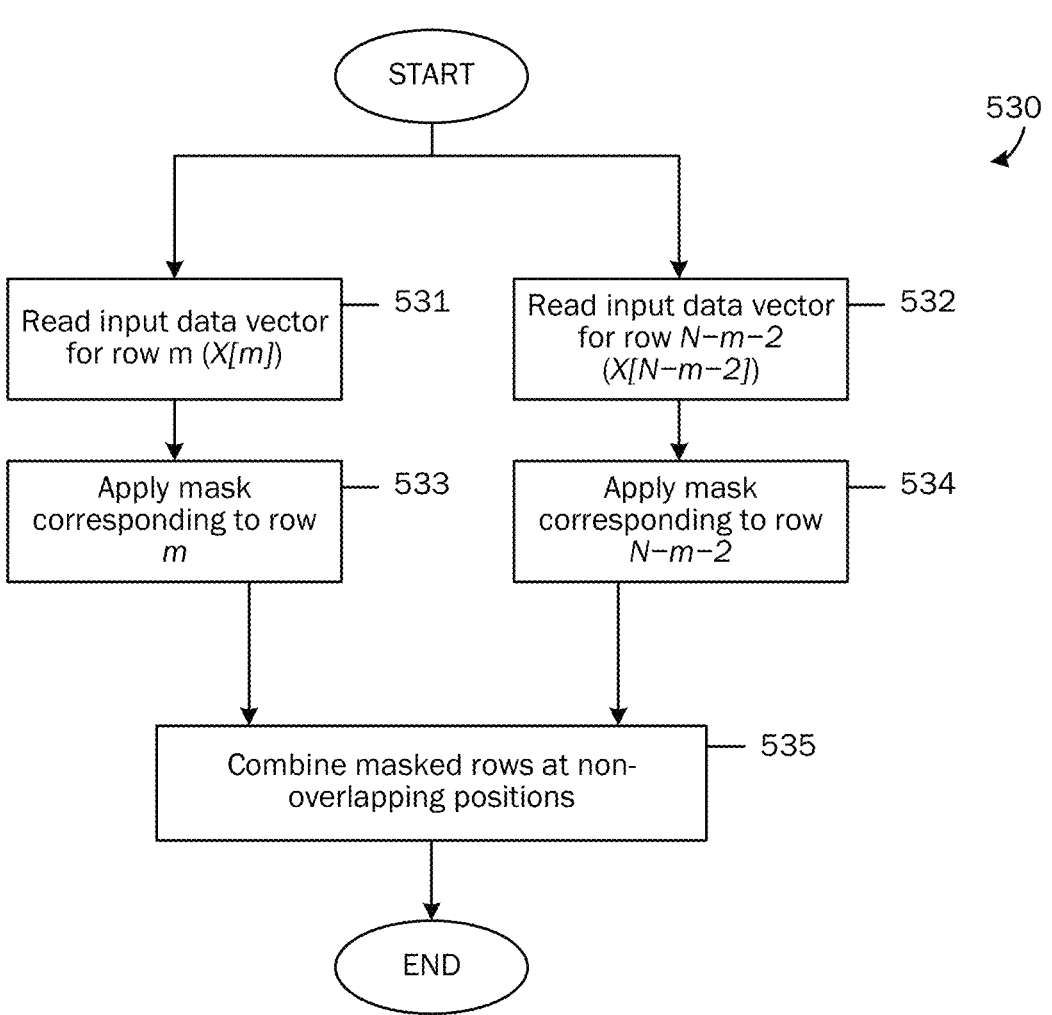
FIG. 5B is a flowchart of a method for applying local data masks and combining masked data vectors to generate a combined data vector according to one example.

FIG. 5B is a flowchart of a method 530 for applying local data masks and combining masked data vectors to generate a combined data vector according to one example. As shown in FIG. 5A, a data masking and row combining circuit 565 of the mask-normalize circuit 561 includes a first local masking block s0 571 and a second local masking block s1 572, which are configured to fetch input data from the BRAM 563 via two separate read ports of the BRAM 563. Iterating over the rows of the padded input data, where the current row is identified by index m, the first local masking block s0 571 performs read operations via a first port (e.g., port #0) of the BRAM 563 to read vector X[m] of the training data from the end of its address at operation 531 and the second local masking block s1 572 performs read operations via a second port (e.g., port #1) of the BRAM 563 to read vector X[N-m-2] from the beginning of its address at operation 532. The read operations may be performed with bit width of SIMD (Single Instruction Multiple Data), where SIMD is the read bandwidth of each BRAM port in units of floating-point data values per read cycle, in other words, the number of floating-point data values that can be read at a time. The value of SIMD is typically smaller than the length N of a row of the input training data. Therefore, each vector X is typically read in SIMD-sized chunks.

The first and second local masking blocks s0 571 and s1 572 each apply a local mask to the data they read from the BRAM 563 The local masking blocks zero out the locations to which the attention mask is applied by computing, for example, a bitwise AND operation between the local mask and the training data vector X read from BRAM 563.

In the case of an upper triangular attention mask as discussed above, the locations at which the attention mask is applied depends on the row. For example, the first local masking block s0 571 initially applies a local mask of a vector of all zeroes (corresponding to the dummy row as shown in FIG. 4B where all of the data values are masked out) whereas the second local masking block s1 572 initially applies a local mask of a vector of all ones (corresponding to the last row with index N−1 as shown in FIG. 4B where none of the data values are masked out). In the upper triangular mask, each local mask for rows between the dummy row and the last row will include one or more is followed by one or more 0s, where the switch from is to 0s occurs at a boundary where the current row index (e.g., m for the first local masking block s0 571 and N−m−2 for the second local masking block s1 572) equals the column index (e.g., at m=0, the first column at index 0 is unmasked and therefore the local mask has a value of 1 at column 0, and all subsequent columns of the local mask for row m=0 have value 0 and at m=k for some value k, columns 0 through k of the mask have value 1 and the remaining columns of the masks, from column k+1 to N−1, have value 0). Accordingly, for a given index m, the first local masking block s0 571 outputs a masked version of vector X[m] of the input data (e.g., with the values at index m+1 through N−1 masked out) and the second local masking block s1 572 outputs a masked version of vector X[N−m−2] of the input data (e.g., with the values at index N−m−1 through N−1 masked out).

At operation 535, an OR gate (or SIMD-wide bitwise-OR gate) 573 combines the masked versions of data vectors X[m] and X[N−m−2] to combine the two rows together into a combined row or combined data vector Xbar (e.g., as shown in FIG. 4C). As noted above, in some embodiments the first local masking block s0 571 performs read operations from the end of its address and the second local masking block s1 572 performs read operations from the start of its address. As such, by storing the data in the local masking block starting at opposite ends of the data vector, the unmasked data values are inserted at non-overlapping locations of the merged vector Xbar. Accordingly, performing a bitwise OR between the two masked data vectors means that the unmasked data values of each of the two input masked data vectors are OR'ed with masked data values of the other masked data vector.

In addition, in some examples, instead of reading from the opposite ends, the first local masking block s0 571 and the second local masking block s1 572 output data values to the OR gate in reverse order from one another. For example, the first local masking block s0 571 may output the higher-indexed columns of the masked data row X[m] before outputting lower-indexed columns (e.g., starting from column index N−1 and proceeding to column index 0) while the second local masking block s1 572 outputs the lower-indexed columns of the complementary masked data row X[N−m−2] before outputting higher-indexed columns (e.g., starting from column index 0 and proceeding to column index N−1).

Figure 5C:
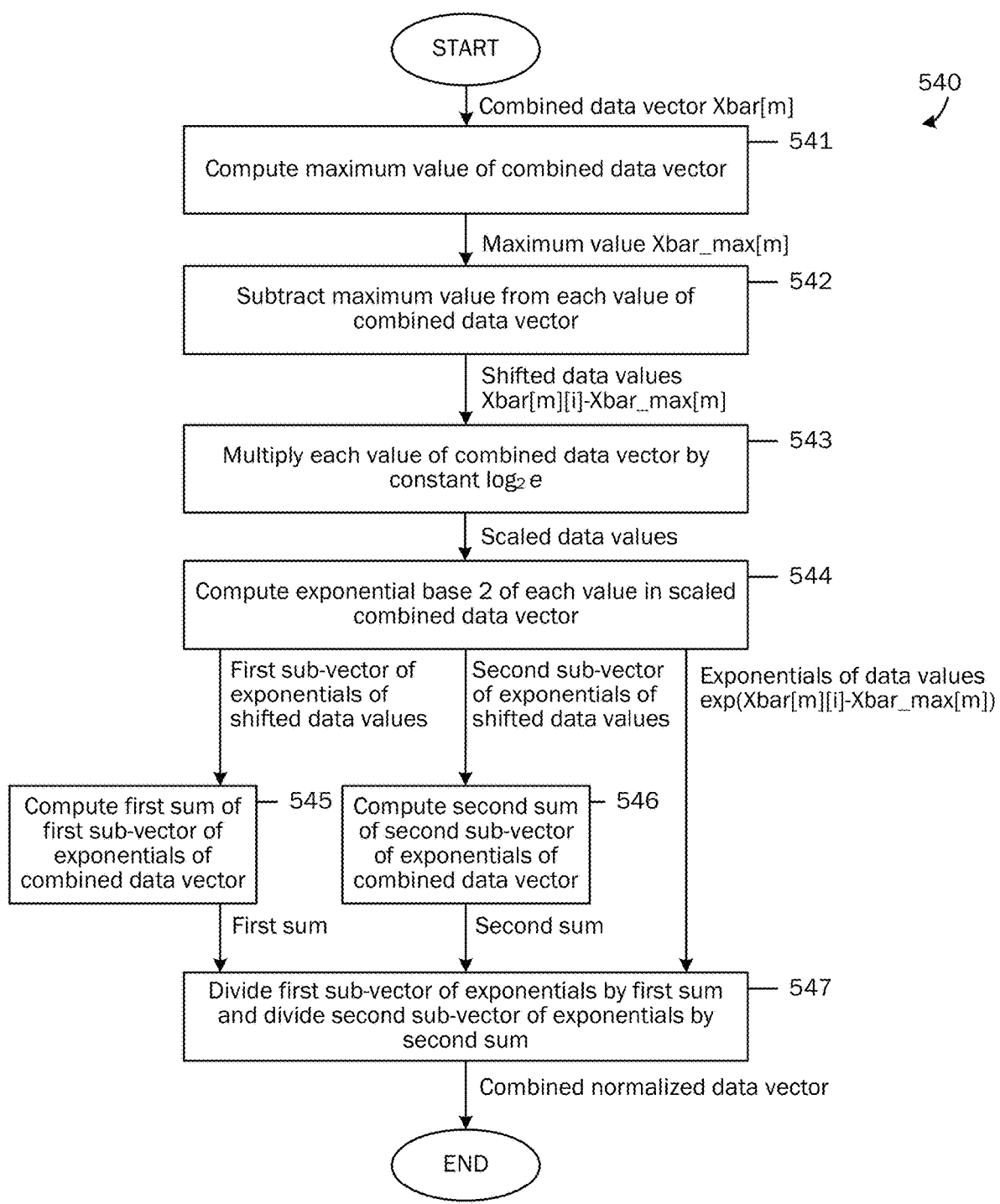
FIG. 5C is a flowchart of a method for computing SoftMax values for the two masked data vectors based on the combined data vector according to one example.

FIG. 5C is a flowchart of a method 540 for computing SoftMax values for the two masked data vectors based on the combined data vector according to one example.

Referring back to FIG. 5A, the combined data vector output by the data masking and row combining circuit 565 (e.g., the output of the OR gate 573) is provided to a data normalization circuit 567 of the mask-normalize circuit 561. The combined data vector is supplied to a reduce-max circuit 581, which identifies or computes, at operation 541, the maximum (largest) value Xbar_max[m] in the combined data vector. A first-in-first-out (FIFO #0) circuit 582 buffers the data vector while the reduce-max circuit 581 computes the maximum (largest) value Xbar_max[m]. At operation 542, a vector subtraction circuit 583 subtracts the maximum value (as determined by the reduce-max circuit 581) from each of the data values in the data vector, at operation 543 a vector multiplier circuit 584 multiples each of the data values the output of the vector subtraction circuit 583 by a constant of $\log_2$ e, and at operation 544 a vector exponential-by-2 circuit 585 computes the exponential, base 2, of each of the values of the output of the vector multiplier circuit 584. As a result, the sequence of blocks 583, 584, and 585 form an exponential circuit 568 of the mask-normalize circuit 561 that computes the exponential values of the shifted data values (exp(Xbar[m][i]−Xbar_max[m])) for each data value at position i in the combined data vector Xbar[m].

A first sub-vector of the exponential values of the shifted data values corresponds to the shifted exponential values of the masked row X[m] of the input training data 510, and a second sub-vector of the exponential values of the shifted data values corresponds to the shifted exponential values of the masked row X[N−m−2] of the input training data 510. For example, in the case of an upper triangular mask as discussed above and where a combined data vector Xbar[m] has the form of a first sub-vector of N−m data values from row X[N−m−1] of the input training data followed by a second sub-vector of m data values from row X[m−1] of the input training data, and therefore the first sub-vector corresponds to the first N−m data elements and the second sub-vector corresponds to the remaining elements (the remaining m elements). At operation 545, a first reduce-add circuit 586 sums the first sub-vector of the exponential values of the shifted data values (the output of the exponential circuit 568) to compute a first sum, and a first reciprocal circuit 587 computes the reciprocal or inverse of the first sum. Likewise, at operation 546, a second reduce-add circuit 588 sums the second sub-vector of the exponential values of the shifted data values to compute a second sum, and a second reciprocal circuit 589 computes the reciprocal or inverse of the second sum.

A second FIFO (FIFO #1) circuit 591 buffers the exponential values of the shifted data values until the reduce-add operations have been computed. The second FIFO circuit 591 supplies the exponential values of the shifted data values to a vector multiplier 593 which divides the exponential values of the first sub-vector by the first sum and divides the exponential values of the second sub-vector by the second sum in operation 547, where a multiplexer 595 selects between supplying the inverse of the first sum and the inverse of the second sum based on the column index of the exponential value to be divided by the first sum or the second sum (e.g., based on whether the exponential data value is in the first sub-vector or the second sub-vector in accordance with the column index). The output of the vector multiplier 593 is a combined vector is a normalized data vector such a vector of normalized SoftMax data values (e.g., a SoftMax normalized exponential data vector of the masked versions of two different rows (e.g., row m and row N−m−2) of the original input data).

While FIG. 5C shows one example of a normalization function that is applied by a mask-normalize circuit of an accelerator according to one example, the present technology is not limited thereto and other circuits may be used in place of the exponential circuit 568 within a mask-normalize circuit 561 to apply different mathematical functions to the unmasked data values in the combined rows.

Figure 5D:
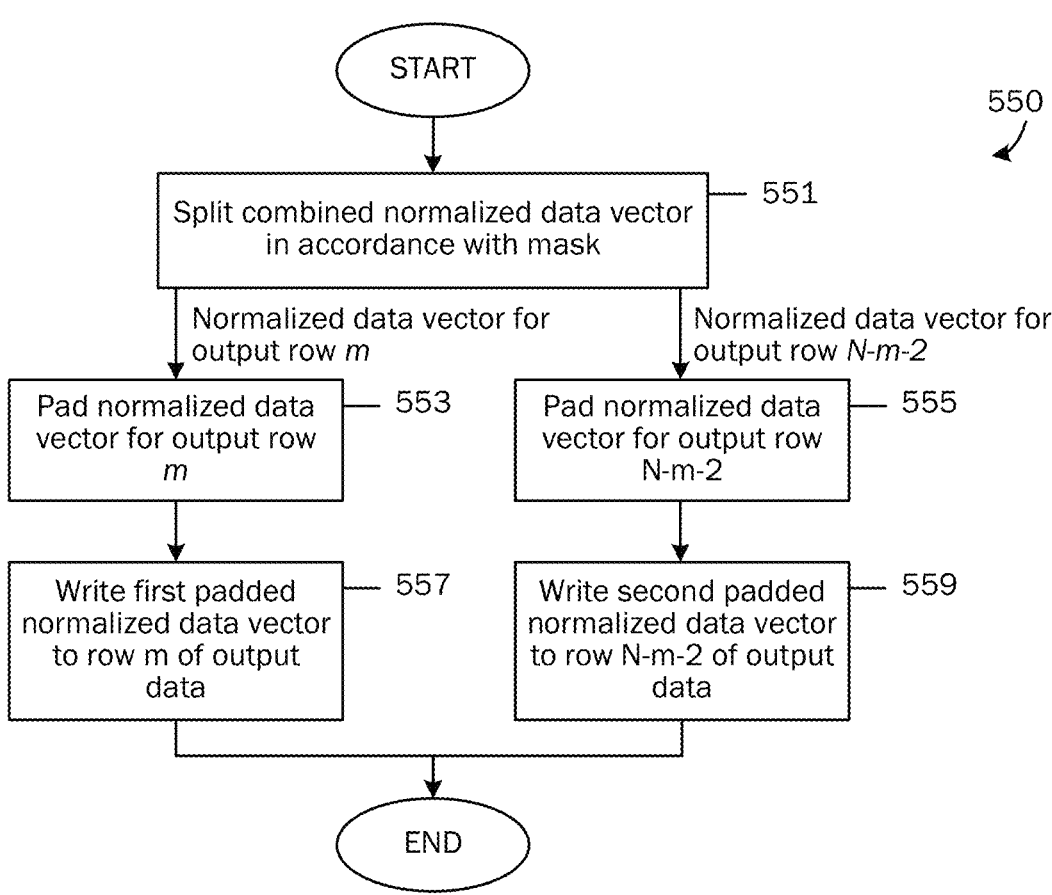
FIG. 5D is a flowchart of a method for splitting and zero padding the combined SoftMax data vector to generate masked SoftMax output data vectors according to one example.

FIG. 5D is a flowchart of a method 550 for splitting and zero padding the combined SoftMax data vector to generate masked SoftMax output data vectors according to one example. the SoftMax output data vectors form an array having the same shape as the input training data 510 (e.g., an N×N matrix). The combined vector of normalized data values (or combined normalized data vector) output by the data normalization circuit 567 of the mask-normalize circuit 561 is supplied to a split-zero padding circuit (or row splitting and padding circuit) 569 of the mask-normalize circuit 561 that is configured to split the combined row of a first sub-vector and a second sub-vector into a corresponding first row of the output (e.g., the m-th row of an output) and a corresponding second row of the output (e.g., the N−m− 2-th row of the output). As shown in FIG. 5D, at operation 551, the row splitting and padding circuit 569 splits the combined normalized data vector in accordance with the mask and the scheme used to generate the combined data vectors Xbar. For example, in the case of an upper triangular mask as discussed above and where a merged normalized data vector Xbar[m] has the form of a first sub-vector of N−m data values from row X[N−m−1] of the input training data followed by a second sub-vector of m data values from row X[m−1] of the input training data, then the first N−m data values of the combined vector of normalized data correspond to row N−m−1 of the output data and the remaining m data values of the combined vector of normalized data correspond to row m−1 of the output data.

In order to increase the length of the rows to match the expected shape (e.g., N×N) of the output data, at operation 553 the row splitting and padding circuit 569 pads the normalized data vector for output row m to N data values by inserting the 0s at the locations of the masked-out values (e.g., as defined by the mask) to generate a first padded data vector. Likewise, at operation 555 the row splitting and padding circuit 569 pads the normalized data vector for output row N−m−2 to a length of N data values by inserting the 0s at the locations of the masked-out values to generate a second padded data vector. At operation 557 the row splitting and padding circuit 569 writes the first padded normalized data vector to the BRAM 563 as row m of the output data 570, and at operation 559 the row splitting and padding circuit 569 writes the second normalized padded data vector to the BRAM 563 as row N−m−2 of the output data 570. The computed output data 570 of masked and normalized data values (e.g., based on SoftMax) may then be written back to the system memory 520 for further use, such as for updating the parameters of a machine learning model based on the normalized output scores in the output data 570.

The embodiment shown in FIG. 5A includes additional circuits that would not be present in a comparative hardware accelerator that performed SoftMax on a row-by-row basis, without combining multiple rows and performing SoftMax on the combined row. For example, the comparative hardware accelerator would not need: the first local masking block s0 571; the second local masking block S1 572; the OR gate 573; the second reduce-add circuit 588; the second reciprocal circuit 589; the multiplexer 595; and the row splitting and padding circuit 569. In one embodiment, the additional reduce-add circuit 588 and reciprocal circuit 589 followed by a 2-to-1 vector multiplexer 595 uses about 100 additional ALMs in an FPGA implementation with SIMD=16 operating on data values in a BFloat16 data format. The addition of the first local masking block s0 571; the second local masking block S1 572; the OR gate 573 and the row splitting and padding circuit 569 adds another approximately 200 ALMs in the FPGA implementation. The overall SoftMax hardware accelerator supporting data mask uses about 18,000 ALMs, and therefore the additional 300 ALMs used in the example embodiment shown in FIG. 5A represents a 1.6% overhead, which can be considered a negligible additional cost in exchange for approximately doubling the throughput of the hardware accelerator.

Figure 6:
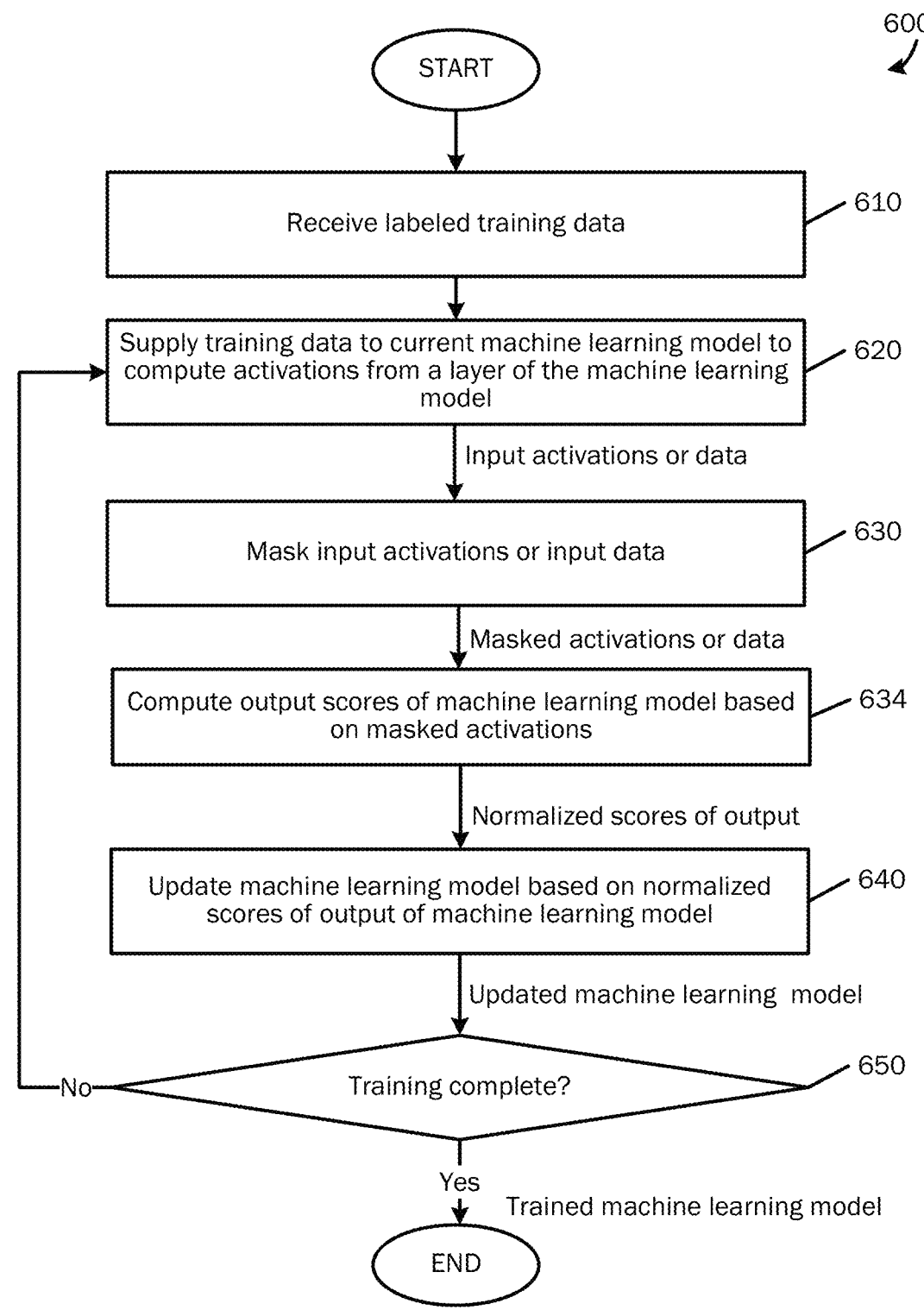
FIG. 6 is a flowchart depicting a method for training a machine learning model, such as a transformer model, using an accelerated data masking circuit according to one example of the present disclosure.
Figure 7:
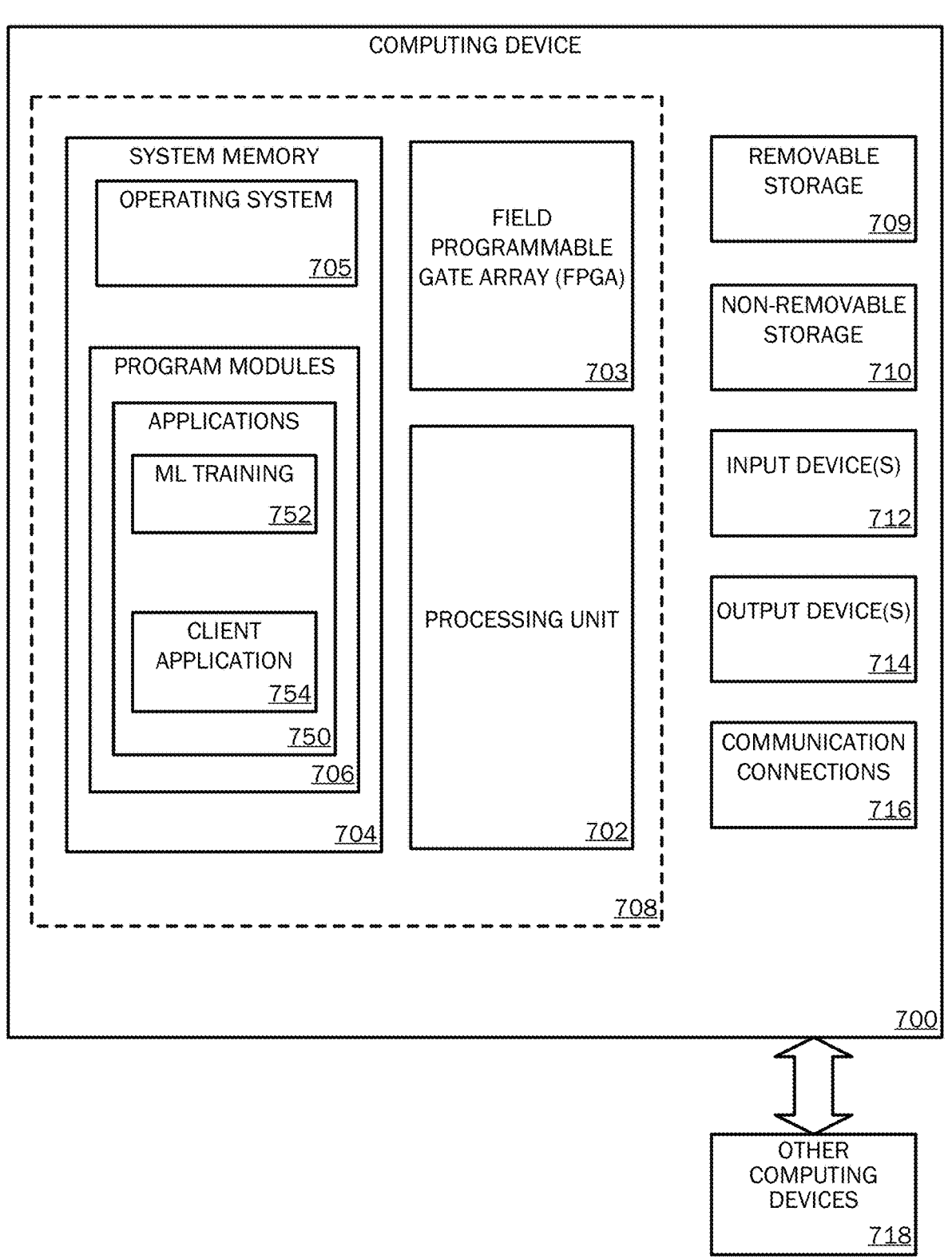
FIG. 7 is a block diagram illustrating example physical components of a computing device with which aspects of the invention may be practiced.

FIG. 6 is a flowchart depicting a method for training a machine learning model, such as a transformer model, using an accelerated data masking circuit according to one example of the present disclosure. In the example shown in FIG. 6, a machine learning model training application (see, e.g., machine learning training application 752 running on a computing device including an FPGA, as shown in FIG. 7) performs a supervised learning algorithm to train a machine learning model, such as a transformer model, based on a collection of labeled input data. In the example shown in FIG. 6, the machine learning model training application receives labeled training data in operation 610, and supplies the training data (e.g., a batch of training data) to a current machine learning model to compute activations (e.g., supplies an input vector of values from a data sample of the training data to a deep neural network, where a layer of the deep neural network generates activations).

In operation 630, the machine learning model training application masks the input activations or training example data. This may include applying a mask to the training example data, whether an external mask received from a system memory or an internal mask generated on the accelerator. In operation 634, the machine learning model training application computes output scores of the machine learning model based on the masked activations or data (e.g., because masked activations calculated using the hardware accelerated computations of the masking of the data were used in the forward propagation of data through the machine learning model). Accordingly, a hardware accelerator such as the hardware accelerator 360 and the hardware accelerator 560, described above, is configured to accelerate the computing of the masked data in operation 630 and the computation of the output scores based on the masked data in operation 634, accordance with the techniques described above with respect to FIGS. 1, 3A, 3B, 4A, 4B, 5A, 5B, 5C, and 5D, such as by applying methods 390, 530, 540, and/or 550. The normalized output scores may be computed using, for example, a SoftMax function to normalize the activations generated by an output layer of the deep neural network or transformer model. While some of the particular examples of a hardware accelerator described above relate to the use of a SoftMax function, the present technology is not limited thereto and in other examples the accelerator is configured to compute different mathematical operations (e.g., compute different mathematical functions) on the masked input data. Furthermore, as discussed above, while some examples are described above in the case of an upper triangular mask, the present technology is not limited thereto and other shapes of masks, such as a block triangular mask, maybe applied to mask the input training data, where the particular sets of complementary rows that are combined into a combined row for application of the mathematical function will depend on the shape of the mask, as would be understood by one skilled in the art.

In operation 640, the machine learning model training application updates the machine learning model based on normalized scores of the output of the machine learning model (where the output is computed based on activations computed in hidden layers or the output layer of the deep neural network using techniques in accordance with the present technology) to generated an updated machine learning model (e.g., in a deep neural network, by comparing the normalized scores with the labels of the training data and updating the weights of the connections between neurons through gradient descent and backpropagation). In operation 650, the machine learning model training application determines whether training is complete (e.g., whether a maximum number of training intervals or training epochs has been completed or if the performance of the machine learning model has converged), and if not, then the training process may continue by returning to operation 620 using the updated machine learning model. If the training process is complete, then the updated machine learning model is output as a trained machine learning model and stored and the training process ends. The stored, trained machine learning model may then be deployed for use in performing inference tasks (e.g., making predictions or estimates) based on live data similar to the training data (e.g., natural language input data, images, etc.) by processing the live data with the trained machine learning model to generate an output (e.g., a classification of the input live data or a predicted next item in a sequence).

Aspects of the present technology also relate to a method for masking a portion of data values and performing computations on unmasked data values in a manner that reduces wasted computations on masked values. Generally, the purpose of an attention mask in a transformer model is to assign a large negative values to the masked-out locations so that the following SoftMax layer in the machine learning model attenuates the masked-out locations to zero when supplied as input to a low-precision exponential function $(\exp(x))$ of the SoftMax layer. In most transformer models (e.g., Bidirectional Encoder Representations from Transformer or BERT, see Devlin, Jacob, et al. "Bert: Pre-training of deep bidirectional transformers for language understanding." arXiv preprint arXiv:1810.04805 (2018).)–10000.0 is used as the masked output value.

As noted above, instead of doing a vector subtraction of –10000.0 when the mask bit is 0, followed by computing exponentials of the large negative number when the final result is known to be 0, aspects of the present technology reorganize the input data by combining complementary-length rows of unmasked data values to reduce or minimize the number of unmasked data values that are supplied to the computational hardware that performs the SoftMax calculations (e.g., hardware performing multiplications and exponentials). In the case of triangular masks where approximately half of the input training data is masked out, the present technology effectively doubles the throughput of the hardware accelerator.

In cases where the attention mask and SoftMax kernel (or other data normalization kernel) have a fixed throughput requirement and where the mask causes 50% of the data values to be masked out, the present technology can approximately reduce the hardware area required to accelerate these computations by 50%.

In cases where the hardware has fixed, SIMD-width data path, the present technology doubles the throughput of the hardware accelerator (in the case where the mask causes 50% of the data values to be masked out) by using more of the SIMD-width data path during each clock cycle (e.g., without wasting portions of the SIMD-width data path performing computations on masked-out data values).

Accordingly, aspects of the present technology provide systems and methods for accelerating the masking of data and computation of normalized values of the masked data within a machine learning architecture, increasing the per-formance of training machine learning models, such as by reducing overall computation (training) time, reducing bandwidth and storage requirements, and/or reducing energy consumption.

Figure 8A:
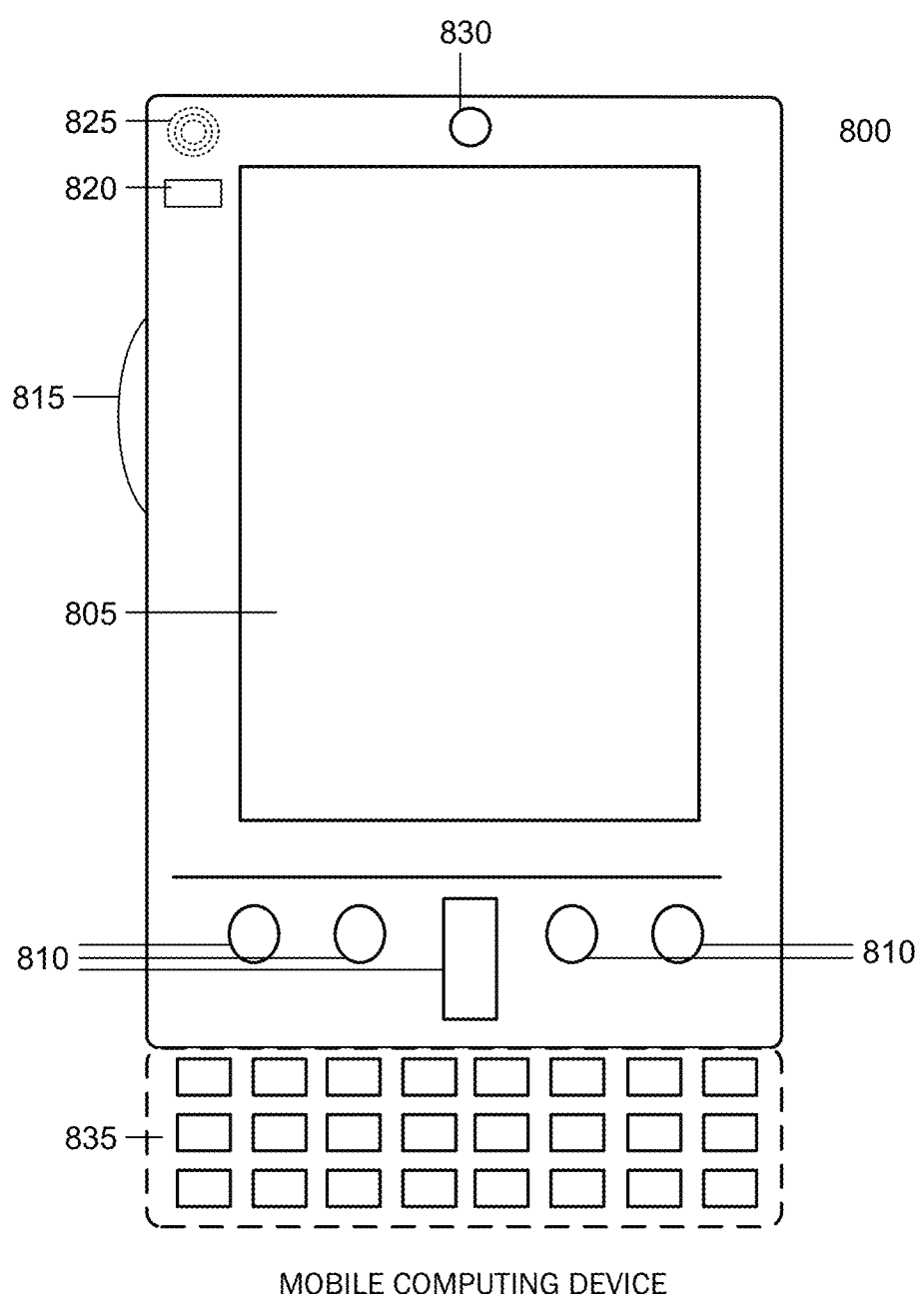
FIGS. 8A and 8B are simplified block diagrams of a mobile computing device with which aspects of the present invention may be practiced.
Figure 8B:
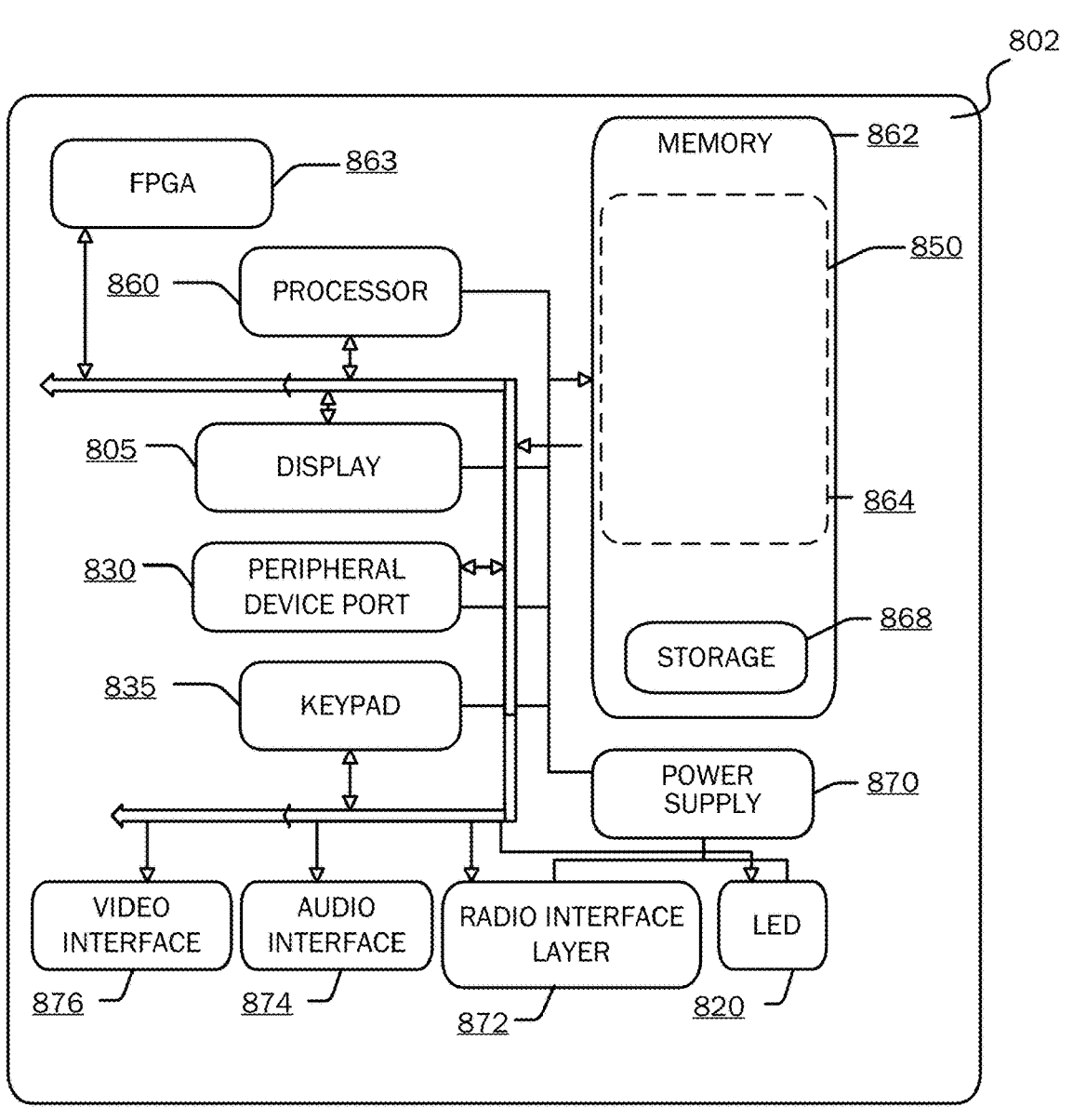

FIGS. 7, 8A, and 8B the associated descriptions provide a discussion of a variety of operating environments in which examples of the present technology may be practiced. However, the devices and systems illustrated and discussed with respect to FIGS. 7, 8A, and 8B are for purposes of example and illustration and are not limiting of a vast number of computing device configurations that may be utilized for practicing aspects of the invention, described herein.

FIG. 7 is a block diagram illustrating physical components (i.e., hardware) of a computing device 700 with which examples of the present disclosure may be practiced. The computing device components described below may be suitable for running a training process for a machine learning model or for performing inference using a trained machine learning model, as described above. In a basic configuration, the computing device 700 may include at least one processing unit 702, a field programmable gate array (FPGA) 703, and a system memory 704. In some examples, the processing unit 702 includes an FPGA 703 (e.g., the processing unit 702 may include an array of logic blocks that are reconfigurable through setting the interconnections). In some examples, the processing unit 702 is integrated or embedded into the FPGA 703 (e.g., in the case where one or more embedded "hard IP" CPU cores are connected directly to the interconnections or fabric of the FPGA 703 and/or one or more embedded "soft IP" CPU cores implemented using logic blocks of the FPGA 703). Depending on the configuration and type of computing device, the system memory 704 may comprise, but is not limited to, volatile storage (e.g., random access memory), non-volatile storage (e.g., read-only memory), flash memory, or any combination of such memories. The system memory 704 may include an operating system 705 and one or more program modules 706 suitable for running software applications 750 such as a machine learning model training application 752 or a client application 754. The operating system 705, for example, may be suitable for controlling the operation of the computing device 700. Furthermore, aspects of the invention may be practiced in conjunction with a graphics library, other operating systems, or any other application program and is not limited to any particular application or system. This basic configuration is illustrated in FIG. 7 by those components within a dashed line 708. The computing device 700 may have additional features or functionality. For example, the computing device 700 may also include additional data storage devices (removable and/or non-removable) such as, for example, magnetic disks, optical disks, or tape. Such additional storage is illustrated in FIG. 7 by a removable storage device 709 and a non-removable storage device 710.

As stated above, a number of program modules and data files may be stored in the system memory 704. While executing on the processing unit 702, the program modules 706 may perform processes that offload computational tasks to the FPGA 703. The FPGA 703 may include data paths configured to accelerate the computation of various mathematical functions including, but not limited to, masking data as described above with respect to FIGS. 1, 3A, 3B, 4A, 4B, 5A, 5B, 5C, and 5D. The FPGA 703 may be configured to include other data paths for implementing other mathematical functions in accordance with examples of the present invention, such as computing a softmax function, an exponential function, a reciprocal square root function, and the like.

Furthermore, examples of the invention may be practiced in an electrical circuit comprising discrete electronic elements, packaged or integrated electronic chips containing logic gates, a circuit utilizing a microprocessor, or on a single chip containing electronic elements or microprocessors. For example, examples of the invention may be practiced via a system-on-a-chip (SOC) where each or many of the components illustrated in FIG. 7 may be integrated onto a single integrated circuit. Such an SOC device may include one or more processing units, field programmable gate arrays, graphics units, communications units, system virtualization units and various application functionality all of which are integrated (or "burned") onto the chip substrate as a single integrated circuit. When operating via an SOC, some functionality, described herein, with respect to training a machine learning model (e.g., a deep neural network) or performing a calculation involving the masking of data, may be operated via application-specific logic integrated with other components of the computing device 700 on the single integrated circuit (chip). Examples of the present disclosure may also be practiced using other technologies capable of performing logical operations such as, for example, AND, OR, and NOT, including but not limited to mechanical, optical, fluidic, and quantum technologies. In addition, aspects of the invention may be practiced within a general purpose computer or in any other circuits or systems.

The computing device 700 may also have one or more input device(s) 712 such as a keyboard, a mouse, a pen, a sound input device, a touch input device, etc. The output device(s) 714 such as a display, speakers, a printer, etc. may also be included. The aforementioned devices are examples and others may be used. In cases where the computing device 700 is a server, such user input devices and user output devices are typically not present or not directly connected to the computing device 700. The computing device 700 may include one or more communication connections 716 allowing communications with other computing devices 718. Examples of suitable communication connections 716 include, but are not limited to, RF transmitter, receiver, and/or transceiver circuitry; universal serial bus (USB), parallel, and/or serial ports.

The term computer readable media as used herein may include computer storage media. Computer storage media may include volatile and nonvolatile, removable and non-removable media implemented in any method or technology for storage of information, such as computer readable instructions, data structures, program modules, or configuration files ("bit files") specifying the configuration of an FPGA to implement particular functionality. The system memory 704, the removable storage device 709, and the non-removable storage device 710 are all computer storage media examples (i.e., memory storage.) Computer storage media may include RAM, ROM, electrically erasable programmable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 700. Any such computer storage media may be part of the computing device 700. Computer storage media does not include a carrier wave or other propagated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

FIGS. 8A and 8B illustrate a mobile computing device 800, for example, a mobile telephone, a smart phone, a tablet personal computer, a laptop computer, and the like, with which aspects of the invention may be practiced. With reference to FIG. 8A, an example of a mobile computing device 800 for implementing the aspects is illustrated. In a basic configuration, the mobile computing device 800 is a handheld computer having both input elements and output elements. The mobile computing device 800 typically includes a display 805 and one or more input buttons 810 that allow the user to enter information into the mobile computing device 800. The display 805 of the mobile computing device 800 may also function as an input device (e.g., a touch screen display). If included, an optional side input element 815 allows further user input. The side input element 815 may be a rotary switch, a button, or any other type of manual input element. In alternative examples, mobile computing device 800 may incorporate more or less input elements. For example, the display 805 may not be a touch screen in some examples. In alternative examples, the mobile computing device 800 is a portable phone system, such as a cellular phone. The mobile computing device 800 may also include an optional keypad 835. Optional keypad 835 may be a physical keypad or a "soft" keypad generated on the touch screen display. In various aspects, the output elements include the display 805 for showing a graphical user interface (GUI), a visual indicator 820 (e.g., a light emitting diode), and/or an audio transducer 825 (e.g., a speaker). In some examples, the mobile computing device 800 incorporates a vibration transducer for providing the user with tactile feedback. In yet another example, the mobile computing device 800 incorporates input and/or output ports, such as an audio input (e.g., a microphone jack), an audio output (e.g., a headphone jack), and a video output (e.g., a HDMI port) for sending signals to or receiving signals from an external device.

FIG. 8B is a block diagram illustrating the architecture of one example of a mobile computing device. That is, the mobile computing device 800 can incorporate a system (i.e., an architecture) 802 to implement some examples. In one example, the system 802 is implemented as a "smart phone" capable of running one or more applications (e.g., browser, e-mail, calendaring, contact managers, messaging clients, games, and media clients/players). In some examples, the system 802 is integrated as a computing device, such as an integrated personal digital assistant (PDA) and wireless phone. As shown in FIG. 8B, the system 802 further includes a processor 860, a memory 862 storing an operating system 864 that may be executed by the processor 860. The system 802 may further include an FPGA 863, which may be configured (using a configuration file or bit file) to implement data paths for accelerating mathematical operations, such as data paths to mask input data as described above according to various examples of the present disclosure.

One or more application programs 850 may be loaded into the memory 862 and run on or in association with the operating system 864. Examples of the application programs include phone dialer programs, e-mail programs, personal information management (PIM) programs, word processing programs, spreadsheet programs, Internet browser programs, messaging programs, machine learning software (e.g., for retraining models and/or federated machine learning) and so forth. The system 802 also includes a non-volatile storage area 868 within the memory 862. The non-volatile storage area 868 may be used to store persistent information that should not be lost if the system 802 is powered down. The application programs 850 may use and store information in the non-volatile storage area 868, such as e-mail or other messages used by an e-mail application, and the like. A synchronization application (not shown) also resides on the system 802 and is programmed to interact with a corresponding synchronization application resident on a host computer to keep the information stored in the non-volatile storage area 868 synchronized with corresponding information stored at the host computer. As should be appreciated, other applications may be loaded into the memory 862 and run on the mobile computing device 800.

The system 802 has a power supply 870, which may be implemented as one or more batteries. The power supply 870 might further include an external power source, such as an AC adapter or a powered docking cradle that supplements or recharges the batteries.

The system 802 may also include a radio 872 that performs the function of transmitting and receiving radio frequency communications. The radio 872 facilitates wireless connectivity between the system 802 and the "outside world," via a communications carrier or service provider. Transmissions to and from the radio 872 are conducted under control of the operating system 864. In other words, communications received by the radio 872 may be disseminated to the application programs 850 via the operating system 864, and vice versa.

The visual indicator 820 may be used to provide visual notifications and/or an audio interface 874 may be used for producing audible notifications via the audio transducer 825. In the illustrated example, the visual indicator 820 is a light emitting diode (LED) and the audio transducer 825 is a speaker. These devices may be directly coupled to the power supply 870 so that when activated, they remain on for a duration dictated by the notification mechanism even though the processor 860 and other components might shut down for conserving battery power. The LED may be programmed to remain on indefinitely until the user takes action to indicate the powered-on status of the device. The audio interface 874 is used to provide audible signals to and receive audible signals from the user. For example, in addition to being coupled to the audio transducer 825, the audio interface 874 may also be coupled to a microphone to receive audible input, such as to facilitate a telephone conversation. The system 802 may further include a video interface 876 that enables an operation of an on-board camera 830 to record still images, video stream, and the like.

A mobile computing device 800 implementing the system 802 may have additional features or functionality. For example, the mobile computing device 800 may also include additional data storage devices (removable and/or non-removable) such as, magnetic disks, optical disks, or tape. Such additional storage is illustrated in FIG. 8B by the non-volatile storage area 868.

Data/information generated or captured by the mobile computing device 800 and stored via the system 802 may be stored locally on the mobile computing device 800, as described above, or the data may be stored on any number of storage media that may be accessed by the device via the radio 872 or via a wired connection between the mobile computing device 800 and a separate computing device associated with the mobile computing device 800, for example, a server computer in a distributed computing network, such as the Internet. As should be appreciated such data/information may be accessed via the mobile computing device 800 via the radio 872 or via a distributed computing network. Similarly, such data/information may be readily transferred between computing devices for storage and use according to well-known data/information transfer and storage means, including electronic mail and collaborative data/information sharing systems.

As will be understood from the foregoing disclosure, one aspect of the technology relates to a method for accelerating computations in a field programmable gate array (FPGA) including a configurable interconnect fabric connecting a plurality of logic blocks, the method including: receiving, at a mask-normalize circuit implemented in the logic blocks and configurable interconnect fabric of the FPGA, input data including data values organized into rows and columns at a plurality of indices of the input data, each row having N data values; selecting, by the mask-normalize circuit, R[i] unmasked data values of a row of the input data in accordance with a mask and an index i of the row; selecting, by the mask-normalize circuit, N−[i] unmasked data values of another row of the input data in accordance with the mask and an index of the another row; merging, by the mask-normalize circuit, the R[i] unmasked data values of the row and the N−[i] data values of the another row to form a combined data vector of N data values; and computing, by the mask-normalize circuit, R[i] normalized values based on the R[i] unmasked data values in a first sub-vector of the combined data vector and N−[i] normalized values based on the N−[i] data values of a second sub-vector of the combined data vector to generate a combined normalized data vector of N normalized data values. The mask may be a triangular mask.

The method may further include: padding the input data with a dummy row, wherein all of the data values of the dummy row are masked and wherein the dummy row has a negative index.

The mask-normalize circuit may be configured to apply a SoftMax function to the unmasked data values in the first sub-vector of the combined data vector and the second sub-vector of the combined data vector to compute the combined normalized data vector of N normalized values based on a maximum unmasked data value of the combined data vector.

The method may further include: padding the R[i] normalized values corresponding to the first sub-vector at masked-out locations in accordance with the mask and the index of the row and a row of normalized output data; and padding the N−[i] normalized values corresponding to the second sub-vector at masked out locations in accordance with the mask and the index of the another row as another row of normalized output data.

The mask-normalize circuit may read the R[i] unmasked data values of the row of the input data via a first port of a device memory of the FPGA in parallel with reading the N−[i] unmasked data values of the another row of the input data via a second port of the device memory of the FPGA.

The merging the R[i] unmasked data values of the row and the N−[i] data values of the another row may be performed by a bitwise OR circuit of the mask-normalize circuit.

The method may further include training a machine learning model, including: receiving, by a machine learning model training application executed by a computing device including a processor, memory, and the FPGA, labeled training data; supplying, by the machine learning model training application, the labeled training data to the machine learning model to generate input data; supplying, by the machine learning model training application, the input data to the mask-normalize circuit implemented in the FPGA to generate masked and normalized data values as output scores; updating the machine learning model based on the output scores; and outputting the updated machine learning model as a trained machine learning model.

One aspect of the technology relates to computer storage media storing a configuration file, the configuration file specifying a configuration of a field programmable gate array (FPGA) including a configurable interconnect fabric and a plurality of logic blocks, where an FPGA configured based on the configuration file includes logic blocks, connected by the configurable interconnect fabric, implementing a mask-normalize circuit configured to: receive input data including data values organized into rows and columns at a plurality of indices of the input data, each row having N data values; select, by a first local masking block, R[i] unmasked data values of a row of the input data in accordance with a mask and an index i of the row; select, by a second local masking block, N−[i] unmasked data values of another row of the input data in accordance with the mask and an index of the another row; merge the R[i] unmasked data values of the row and the N−[i] data values of the another row to form a combined data vector of N data values; and compute R[i] normalized values based on the R[i] unmasked data values in a first sub-vector of the combined data vector and N−[i] normalized values based on the N−[i] data values of a second sub-vector of the combined data vector to generate a combined normalized data vector of N normalized data values. The mask may be a triangular mask.

The configuration file may further specify the configuration of the configurable interconnect fabric and the logic blocks of the FPGA to pad the input data with a dummy row, wherein all of the data values of the dummy row are masked and wherein the dummy row has a negative index.

The configuration file may further specify the configuration of the configurable interconnect fabric and the logic blocks of the FPGA to implement an exponential circuit configured to apply a SoftMax function to the unmasked data values in the first sub-vector of the combined data vector and the second sub-vector of the combined data vector to compute the combined normalized data vector of N normalized values based on a maximum unmasked data value of the combined data vector.

The configuration file may further specify the configuration of the configurable interconnect fabric and the logic blocks of the FPGA to implement a row splitting and padding circuit configured to: pad the R[i] normalized values corresponding to the first sub-vector at masked-out locations in accordance with the mask and the index of the row and a row of normalized output data; and pad the N−[i] normalized values corresponding to the second sub-vector at masked out locations in accordance with the mask and the index of the another row as another row of normalized output data.

The configuration file may further specify the configuration of the configurable interconnect fabric and the logic blocks of the FPGA to connect the first local masking block to a first port of a device memory of the FPGA and to connect the second local masking block to a second port of the device memory of the FPGA.

One aspect of the present technology relates to a field programmable gate array (FPGA) including a configurable interconnect fabric connecting a plurality of logic blocks, the configurable interconnect fabric and the logic blocks being configured to implement a mask-normalize circuit configured to: receive input data including data values organized into rows and columns at a plurality of indices of the input data, each row having N data values; select, by a first local masking block, R[i] unmasked data values of a row of the input data in accordance with a mask and an index i of the row; select, by a second local masking block, N−[i] unmasked data values of another row of the input data in accordance with the mask and an index of the another row; merge the R[i] unmasked data values of the row and the N−[i] data values of the another row to form a combined data vector of N data values; and compute R[i] normalized values based on the R[i] unmasked data values in a first sub-vector of the combined data vector and N−[i] normalized values based on the N−[i] data values of a second sub-vector of the combined data vector to generate a combined normalized data vector of N normalized data values. The mask may be a triangular mask.

The mask-normalize circuit may be further configured to pad the input data with a dummy row, wherein all of the data values of the dummy row are masked and wherein the dummy row has a negative index.

The mask-normalize circuit may include an exponential circuit configured to apply a SoftMax function to the unmasked data values in the first sub-vector of the combined data vector and the second sub-vector of the combined data vector to compute the combined normalized data vector of N normalized values based on a maximum unmasked data value of the combined data vector.

The mask-normalize circuit may include a row splitting and padding circuit configured to: pad the R[i] normalized values corresponding to the first sub-vector at masked-out locations in accordance with the mask and the index of the row and a row of normalized output data; and pad the N−[i] normalized values corresponding to the second sub-vector at masked out locations in accordance with the mask and the index of the another row as another row of normalized output data.

The first local masking block may be connected to a first port of a device memory of the FPGA and the second local masking block is connected to a second port of the device memory of the FPGA.

Aspects of the present invention, for example, are described above with reference to block diagrams and/or operational illustrations of methods, systems, and computer program products according to aspects of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved. Further, as used herein and in the claims, the phrase "at least one of element A, element B, or element C" is intended to convey any of: element A, element B, element C, elements A and B, elements A and C, elements B and C, and elements A, B, and C.

The description and illustration of one or more examples provided in this application are not intended to limit or restrict the scope of the invention as claimed in any way.

The aspects, examples, and details provided in this application are considered sufficient to convey possession and enable others to make and use the best mode of claimed invention. The claimed invention should not be construed as being limited to any aspect, example, or detail provided in this application. Regardless of whether shown and described in combination or separately, the various features (both structural and methodological) are intended to be selectively included or omitted to produce an example with a particular set of features. Having been provided with the description and illustration of the present application, one skilled in the art may envision variations, modifications, and alternate examples falling within the spirit of the broader aspects of the general inventive concept embodied in this application that do not depart from the broader scope of the claimed invention.

I claim:

1. A method for accelerating computations in a field programmable gate array (FPGA) comprising a configurable interconnect fabric connecting a plurality of logic blocks, the method comprising:

receiving, at a mask-normalize circuit implemented in the logic blocks and configurable interconnect fabric of the FPGA, input data including data values organized into rows and columns at a plurality of indices of the input data, each row having N data values;

selecting, by the mask-normalize circuit, R[i] unmasked data values of a row of the input data in accordance with a mask and an index i of the row;

selecting, by the mask-normalize circuit, N−R[i] unmasked data values of another row of the input data in accordance with the mask and an index of the another row;

merging, by the mask-normalize circuit, the R[i] unmasked data values of the row and the N−R[i] data values of the another row to form a combined data vector of N data values; and computing, by a data normalization circuit of the mask-normalize circuit comprising a first accumulator and a second accumulator:

R[i] normalized values based on the R[i] unmasked data values in a first sub-vector of the combined data vector, wherein the data normalization circuit accumulates, in the first accumulator, a first denominator based on the R[i] unmasked data values of the first sub-vector and computes the R[i] normalized values based on the first denominator; and N−R[i] normalized values based on the N−R[i] data values of a second sub-vector of the combined data vector to generate a combined normalized data vector of N normalized data values, wherein the data normalization circuit accumulates, in the second accumulator, a second denominator based on the N−R[i] unmasked data values of the second sub-vector and computes the N−R[i] normalized values based on the second denominator.

2. The method of claim 1, wherein the mask is a triangular mask.

3. The method of claim 1, further comprising:

padding the input data with a dummy row, wherein all of the data values of the dummy row are masked and wherein the dummy row has a negative index.

4. The method of claim 1, wherein the mask-normalize circuit is configured to apply a SoftMax function to the unmasked data values in the first sub-vector of the combined data vector and the second sub-vector of the combined data vector to compute the combined normalized data vector of N normalized values based on a maximum unmasked data value of the combined data vector.

5. The method of claim 1, further comprising:

padding the R[i] normalized values corresponding to the first sub-vector at masked-out locations in accordance with the mask and the index of the row and a row of normalized output data; and padding the N−R[i] normalized values corresponding to the second sub-vector at masked out locations in accordance with the mask and the index of the another row as another row of normalized output data.

6. The method of claim 1, wherein the mask-normalize circuit reads the R[i] unmasked data values of the row of the input data via a first port of a device memory of the FPGA in parallel with reading the N−R[i] unmasked data values of the another row of the input data via a second port of the device memory of the FPGA.

7. The method of claim 1, wherein the merging the R[i] unmasked data values of the row and the N−R[i] data values of the another row is performed by a bitwise OR circuit of the mask-normalize circuit.

8. The method of claim 1, further comprising training a machine learning model, comprising:

receiving, by a machine learning model training application executed by a computing device comprising a processor, memory, and the FPGA, labeled training data;

supplying, by the machine learning model training application, the labeled training data to the machine learning model to generate input data;

supplying, by the machine learning model training application, the input data to the mask-normalize circuit implemented in the FPGA to generate masked and normalized data values as output scores;

updating the machine learning model based on the output scores; and outputting the updated machine learning model as a trained machine learning model.

9. Computer storage media storing a configuration file, the configuration file specifying a configuration of a field programmable gate array (FPGA) comprising a configurable interconnect fabric and a plurality of logic blocks, where an FPGA configured based on the configuration file comprises logic blocks, connected by the configurable interconnect fabric, implementing a mask-normalize circuit comprising a data normalization circuit, the mask-normalize circuit being configured to:

receive input data including data values organized into rows and columns at a plurality of indices of the input data, each row having N data values;

select, by a first local masking block, R[i] unmasked data values of a row of the input data in accordance with a mask and an index i of the row;

select, by a second local masking block, N−R[i] unmasked data values of another row of the input data in accordance with the mask and an index of the another row;

merge the R[i] unmasked data values of the row and the N−R[i] data values of the another row to form a combined data vector of N data values; and compute, by the data normalization circuit comprising a first accumulator and a second accumulator:

R[i] normalized values based on the R[i] unmasked data values in a first sub-vector of the combined data vector, wherein the data normalization circuit accumulates, in the first accumulator, a first denominator based on the R[i] unmasked data values of the first sub-vector and computes the R[i] normalized values based on the first denominator; and N−R[i] normalized values based on the N−R[i] data values of a second sub-vector of the combined data vector to generate a combined normalized data vector of N normalized data values, wherein the data normalization circuit accumulates, in the second accumulator, a second denominator based on the N−R[i] unmasked data values of the second sub-vector and computes the N−R[i] normalized values based on the second denominator.

10. The computer storage media of claim 9, wherein the mask is a triangular mask.

11. The computer storage media of claim 9, wherein the configuration file further specifies the configuration of the configurable interconnect fabric and the logic blocks of the FPGA to pad the input data with a dummy row, wherein all of the data values of the dummy row are masked and wherein the dummy row has a negative index.

12. The computer storage media of claim 9, wherein the configuration file further specifies the configuration of the configurable interconnect fabric and the logic blocks of the FPGA to implement an exponential circuit configured to apply a SoftMax function to the unmasked data values in the first sub-vector of the combined data vector and the second sub-vector of the combined data vector to compute the combined normalized data vector of N normalized values based on a maximum unmasked data value of the combined data vector.

13. The computer storage media of claim 9, wherein the configuration file further specifies the configuration of the configurable interconnect fabric and the logic blocks of the FPGA to implement a row splitting and padding circuit configured to:

pad the R[i] normalized values corresponding to the first sub-vector at masked-out locations in accordance with the mask and the index of the row and a row of normalized output data; and pad the N−R[i] normalized values corresponding to the second sub-vector at masked out locations in accordance with the mask and the index of the another row as another row of normalized output data.

14. The computer storage media of claim 9, wherein the configuration file further specifies the configuration of the configurable interconnect fabric and the logic blocks of the FPGA to connect the first local masking block to a first port of a device memory of the FPGA and to connect the second local masking block to a second port of the device memory of the FPGA.

15. A field programmable gate array (FPGA) comprising a configurable interconnect fabric connecting a plurality of logic blocks, the configurable interconnect fabric and the logic blocks being configured to implement a mask-normalize circuit comprising a data normalization circuit, the mask-normalize circuit being configured to:

receive input data including data values organized into rows and columns at a plurality of indices of the input data, each row having N data values;

select, by a first local masking block, R[i] unmasked data values of a row of the input data in accordance with a mask and an index i of the row;

select, by a second local masking block, N−R[i] unmasked data values of another row of the input data in accordance with the mask and an index of the another row;

merge the R[i] unmasked data values of the row and the N−R[i] data values of the another row to form a combined data vector of N data values; and compute, by the data normalization circuit comprising a first accumulator and a second accumulator:

R[i] normalized values based on the R[i] unmasked data values in a first sub-vector of the combined data vector, wherein the data normalization circuit accumulates, in the first accumulator, a first denominator based on the R[i] unmasked data values of the first sub-vector and computes the R[i] normalized values based on the first denominator; and N−R[i] normalized values based on the N−R[i] data values of a second sub-vector of the combined data vector to generate a combined normalized data vector of N normalized data values, wherein the data normalization circuit accumulates, in the second accumulator, a second denominator based on the N−R[i] unmasked data values of the second sub-vector and computes the N−R[i] normalized values based on the second denominator.

16. The FPGA of claim 15, wherein the mask is a triangular mask.

17. The FPGA of claim 15, wherein the mask-normalize circuit is further configured to pad the input data with a dummy row, wherein all of the data values of the dummy row are masked and wherein the dummy row has a negative index.

18. The FPGA of claim 15, wherein the mask-normalize circuit comprises an exponential circuit configured to apply a SoftMax function to the unmasked data values in the first sub-vector of the combined data vector and the second sub-vector of the combined data vector to compute the combined normalized data vector of N normalized values based on a maximum unmasked data value of the combined data vector.

19. The FPGA of claim 15, wherein the mask-normalize circuit comprises a row splitting and padding circuit configured to:

pad the R[i] normalized values corresponding to the first sub-vector at masked-out locations in accordance with the mask and the index of the row and a row of normalized output data; and pad the N−R[i] normalized values corresponding to the second sub-vector at masked out locations in accordance with the mask and the index of the another row as another row of normalized output data.

20. The FPGA of claim 15, wherein the first local masking block is connected to a first port of a device memory of the FPGA and the second local masking block is connected to a second port of the device memory of the FPGA.

* * * * *